United States Patent
Kim et al.

(10) Patent No.: US 9,704,690 B2
(45) Date of Patent: Jul. 11, 2017

(54) PLASMA APPARATUS AND METHOD OF OPERATING THE SAME

(71) Applicant: Samsung Electronics Co., Ltd., Suwon-si (KR)

(72) Inventors: Moojin Kim, Suwon-si (KR); Bongseong Kim, Yongin-si (KR); Unjoo Lee, Seoul (KR)

(73) Assignee: SAMSUNG ELECTRONICS CO., LTD., Samsung-ro, Yeongtung-gu, Suwon-si, Gyeonggi-do (KR)

( * ) Notice: Subject to any disclaimer, the term of this patent is extended or adjusted under 35 U.S.C. 154(b) by 22 days.

(21) Appl. No.: 14/799,588

(22) Filed: Jul. 15, 2015

(65) Prior Publication Data

US 2016/0056017 A1 Feb. 25, 2016

(30) Foreign Application Priority Data

Aug. 19, 2014 (KR) ........................ 10-2014-0107847

(51) Int. Cl.
*H01J 37/32* (2006.01)

(52) U.S. Cl.
CPC ...... *H01J 37/321* (2013.01); *H01J 37/32706* (2013.01); *H01J 37/32972* (2013.01)

(58) Field of Classification Search
None
See application file for complete search history.

(56) References Cited

U.S. PATENT DOCUMENTS

| | | | |
|---|---|---|---|
| 6,187,685 B1 | 2/2001 | Hopkins et al. | |
| 6,756,560 B2 * | 6/2004 | Barnett | B23K 10/022 219/121.45 |
| 7,713,430 B2 | 5/2010 | Wilson | |
| 8,461,554 B1 | 6/2013 | Kurunczi et al. | |
| 8,501,631 B2 | 8/2013 | Valcore, Jr. et al. | |
| 9,105,447 B2 * | 8/2015 | Brouk | H01J 37/32091 |
| 9,208,992 B2 * | 12/2015 | Brouk | C23C 14/345 |
| 9,210,790 B2 * | 12/2015 | Hoffman | H05H 1/46 |
| 9,287,086 B2 * | 3/2016 | Brouk | C23C 14/345 |
| 9,287,092 B2 * | 3/2016 | Brouk | C23C 14/54 |
| 9,309,594 B2 * | 4/2016 | Hoffman | C23C 14/345 |
| 9,355,822 B2 * | 5/2016 | Yamada | H01J 37/32091 |
| 9,362,089 B2 * | 6/2016 | Brouk | H01J 37/32009 |

(Continued)

*Primary Examiner* — Douglas W Owens
*Assistant Examiner* — Srinivas Sathiraju
(74) *Attorney, Agent, or Firm* — Muir Patent Law, PLLC

(57) ABSTRACT

A plasma apparatus includes a chuck disposed in a process chamber, a gas supply unit supplying a process gas into the process chamber, a plasma generating unit configured to generate plasma over the chuck, a direct current (DC) power generator applying a DC pulse signal to the chuck, and a sensor monitoring a state of the plasma and providing a sensing signal to the DC power generator. Each period of the DC pulse signal includes a negative pulse duration, a positive pulse duration, and a pulse-off duration. If a signal disturbance of the sensing signal occurs in an $n^{th}$ period of the DC pulse signal, the DC power generator changes a magnitude of a positive pulse and/or a length of the positive pulse duration of an $n+1^{th}$ period of the DC pulse signal, where "n" denotes a natural number.

20 Claims, 17 Drawing Sheets

(56) References Cited

U.S. PATENT DOCUMENTS

| | | | |
|---|---|---|---|
| 9,435,029 B2* | 9/2016 | Brouk | C23C 14/345 |
| 2004/0127031 A1* | 7/2004 | Klekotka | H01J 37/32082 |
| | | | 438/689 |
| 2009/0120581 A1* | 5/2009 | Qin | G01N 21/73 |
| | | | 156/345.24 |
| 2011/0248633 A1* | 10/2011 | Nauman | C23C 14/3485 |
| | | | 315/111.21 |
| 2012/0283973 A1 | 11/2012 | Samara et al. | |
| 2013/0059448 A1 | 3/2013 | Marakhtanov et al. | |
| 2013/0206338 A1 | 8/2013 | Tanaka | |
| 2015/0325413 A1* | 11/2015 | Kim | H01J 37/32715 |
| | | | 315/111.21 |

* cited by examiner

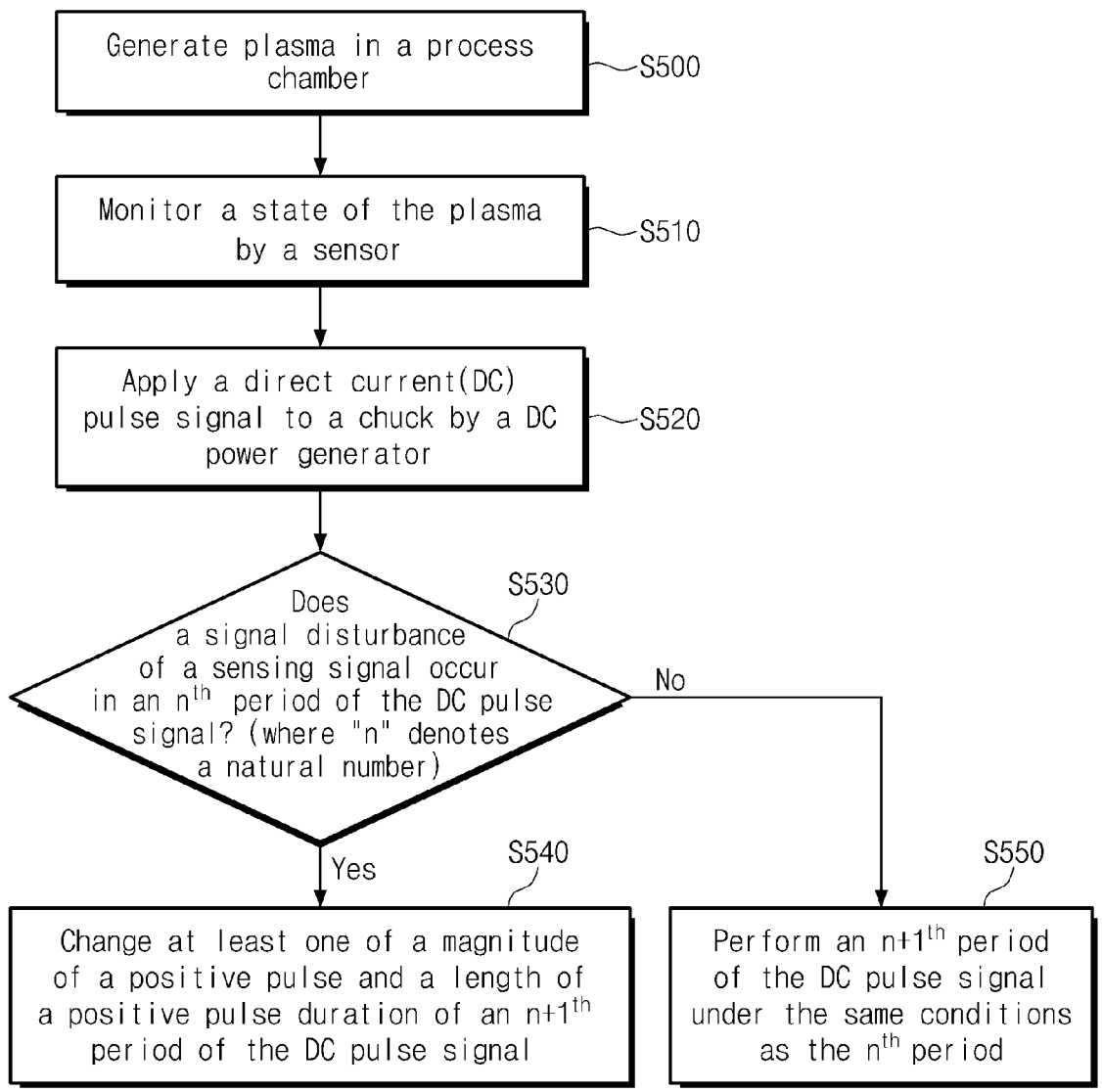

PLASMA APPARATUS AND METHOD OF OPERATING THE SAME

CROSS-REFERENCE TO RELATED APPLICATION

This U.S. non-provisional patent application claims priority under 35 U.S.C. §119 to Korean Patent Application No. 10-2014-0107847, filed on Aug. 19, 2014, in the Korean Intellectual Property Office, the disclosure of which is hereby incorporated by reference in its entirety.

BACKGROUND

Semiconductor devices are widely used in the electronic industry because of their small sizes, multi-functions, and/or low manufacturing costs. Semiconductor devices may be formed using various semiconductor manufacturing processes such as deposition, ion implantation, photolithography, and etching. Some of the semiconductor manufacturing processes may be performed using plasma. As semiconductor devices have been highly integrated, sizes of patterns constituting semiconductor devices have been reduced and aspect ratios of the patterns have been increased. The size reduction and/or the aspect ratio increase of the patterns may cause various problems with semiconductor manufacturing processes that use plasma.

SUMMARY

Embodiments of the disclosure may provide a plasma apparatus capable of improving reliability of semiconductor manufacturing processes.

Embodiments of the disclosure may also provide a plasma apparatus capable of minimizing or preventing an arching phenomenon.

Embodiments of the disclosure may also provide a method of operating the plasma apparatus.

A plasma apparatus may include: a process chamber having an inner, enclosed space; a chuck disposed in the process chamber and having a top surface configured to load a substrate; a gas supply unit supplying a process gas into the process chamber; a plasma generating unit configured to generate plasma over the chuck; a direct current (DC) power generator applying a first DC pulse signal to the chuck; and a sensor monitoring a state of the plasma and providing a sensing signal to the DC power generator. Each period of the first DC pulse signal may include: a negative pulse duration during which a negative pulse is applied; a positive pulse duration during which a positive pulse is applied; and a pulse-off duration during which the negative pulse and the positive pulse are turned-off. If the sensor detects a signal disturbance and provides the sensing signal of an $n^{th}$ period of the first DC pulse signal, the DC power generator may change at least one of a magnitude of the positive pulse and a length of the positive pulse duration of the first DC pulse signal of an $n+1^{th}$ period, where "n" denotes a natural number.

The chuck may be an electrostatic chuck, and an insulator may be disposed between the chuck and a bottom plate of the process chamber. The sensor may be configured to measure an intensity of a light generated from the plasma and provide the sensing signal in real time. The sensor may be an optical emission sensor.

In some embodiments, the DC power generator may include: a negative power supply generating the negative pulse; a positive power supply generating the positive pulse; a pulse modulator modulating output times of the negative pulse and the positive pulse when outputting the first DC pulse signal; and a controller controlling the negative power supply, the positive power supply, and the pulse modulator. The controller may receive the sensing signal from the sensor to change at least one of the magnitude of the positive pulse and the length of the positive pulse duration.

In some embodiments, if the signal disturbance occurs in the negative pulse duration of the $n^{th}$ period, at least one of the magnitude of the positive pulse and the length of the positive pulse duration of the $n+1^{th}$ period may be increased by the DC power generator as compared to at least one of a magnitude of the positive pulse and a length of the positive pulse duration of the $n^{th}$ period.

In some embodiments, if the signal disturbance occurs in the positive pulse duration of the $n^{th}$ period, at least one of the magnitude of the positive pulse and the length of the positive pulse duration of the $n+1^{th}$ period may be reduced by the DC power generator as compared to at least one of a magnitude of the positive pulse and a length of the positive pulse duration of the $n^{th}$ period.

In some embodiments, the positive pulse duration may occur at a time after the negative pulse duration but before the pulse-off duration in each period of the first DC pulse signal. Each period of the first DC pulse signal may further include a stable duration at a time after the negative pulse duration but before the positive pulse duration. A ground voltage or a DC offset from a ground potential may be applied during the stable duration and the pulse-off duration. The stable duration and the positive pulse duration may be sequentially between the negative pulse duration and the pulse-off duration. The negative pulse duration may be less than the sum of the positive pulse duration, the pulse-off duration, and the stable duration. The pulse-off duration may be in a range of twice as long and 100 times as long as the stable duration.

In some embodiments, a length of the stable duration of the $n^{th}$ period may be different from a length of the pulse-off duration of the $n^{th}$ period.

In some embodiments, a length of the stable duration of the $n+1^{th}$ period may be different from a length of the pulse-off duration of the $n+1^{th}$ period.

In some embodiments, a total length of the $n^{th}$ period may be equal to a total length of the $n+1^{th}$ period.

In some embodiments, the DC power generator may change at least one of a magnitude of the positive pulse and a length of the positive pulse duration of an $n+2^{th}$ period. However, the disclosure is not limited to changes being in only the $n+1^{th}$ and $n+2^{th}$ periods subsequent the $n^{th}$ period. Changes may therefore continue into the third and fourth periods, for example. After a change is made to either or both of the magnitude of the positive pulse and length of the positive pulse duration and upon the sensor not detecting further signal disturbances the magnitude and duration of the positive pulses may remain the same in subsequent periods.

In some embodiments, a magnitude of the negative pulse (i.e. absolute value voltage) of the $n^{th}$ period may be greater than a magnitude of the positive pulse of the $n^{th}$ period, and a magnitude of the negative pulse of the $n+1^{th}$ period may be greater than a magnitude of the positive pulse of the $n+1^{th}$ period.

In some embodiments, the plasma apparatus may further include: an outer ring disposed on an edge of the chuck and surrounding the loaded substrate. A first or second DC pulse signal may be applied to the outer ring. Each period of the second DC pulse signal may include: a negative pulse duration during which a second negative pulse is applied; a positive pulse duration during which a second positive pulse is applied; and a pulse-off duration during which the second negative pulse and the second positive pulse are turned-off. Each period of the second DC pulse signal may be synchronized with each period of the first DC pulse signal applied to the chuck.

In another aspect, a method of operating a plasma apparatus may include: loading a substrate on a chuck disposed in a process chamber; supplying a process gas into the process chamber; generating plasma over the chuck; applying a direct current (DC) pulse signal to the chuck by a DC power generator, each period of the DC pulse signal comprising a negative pulse duration during which a negative pulse is applied, a positive pulse duration during which a positive pulse is applied, and a pulse-off duration during which the negative pulse and the positive pulse are turned-off; monitoring a state of the plasma by a sensor, the sensor providing a sensing signal to the DC power generator; and changing at least one of a magnitude of the positive pulse and a length of the positive pulse duration of an $n+1^{th}$ period of the DC pulse signal if the sensor detects a signal disturbance and provides the sensing signal in an $n^{th}$ period of the DC pulse signal, where "n" denotes a natural number.

In some embodiments, if the signal disturbance occurs in the negative pulse duration of the $n^{th}$ period, at least one of the magnitude of the positive pulse and the length of the positive pulse duration of the $n+1^{th}$ period may be increased as compared to at least one of a magnitude of the positive pulse and a length of the positive pulse duration of the $n^{th}$ period.

In some embodiments, if the signal disturbance occurs in the positive pulse duration of the $n^{th}$ period, at least one of the magnitude of the positive pulse and the length of the positive pulse duration of the $n+1^{th}$ period may be reduced as compared to at least one of the magnitude of the positive pulse and the length of the positive pulse duration of the $n^{th}$ period.

BRIEF DESCRIPTION OF THE DRAWINGS

FIG. 3 is a flowchart illustrating a method of operating a plasma apparatus according to some embodiments of the disclosure;

DETAILED DESCRIPTION OF THE EMBODIMENTS

Figure 1:
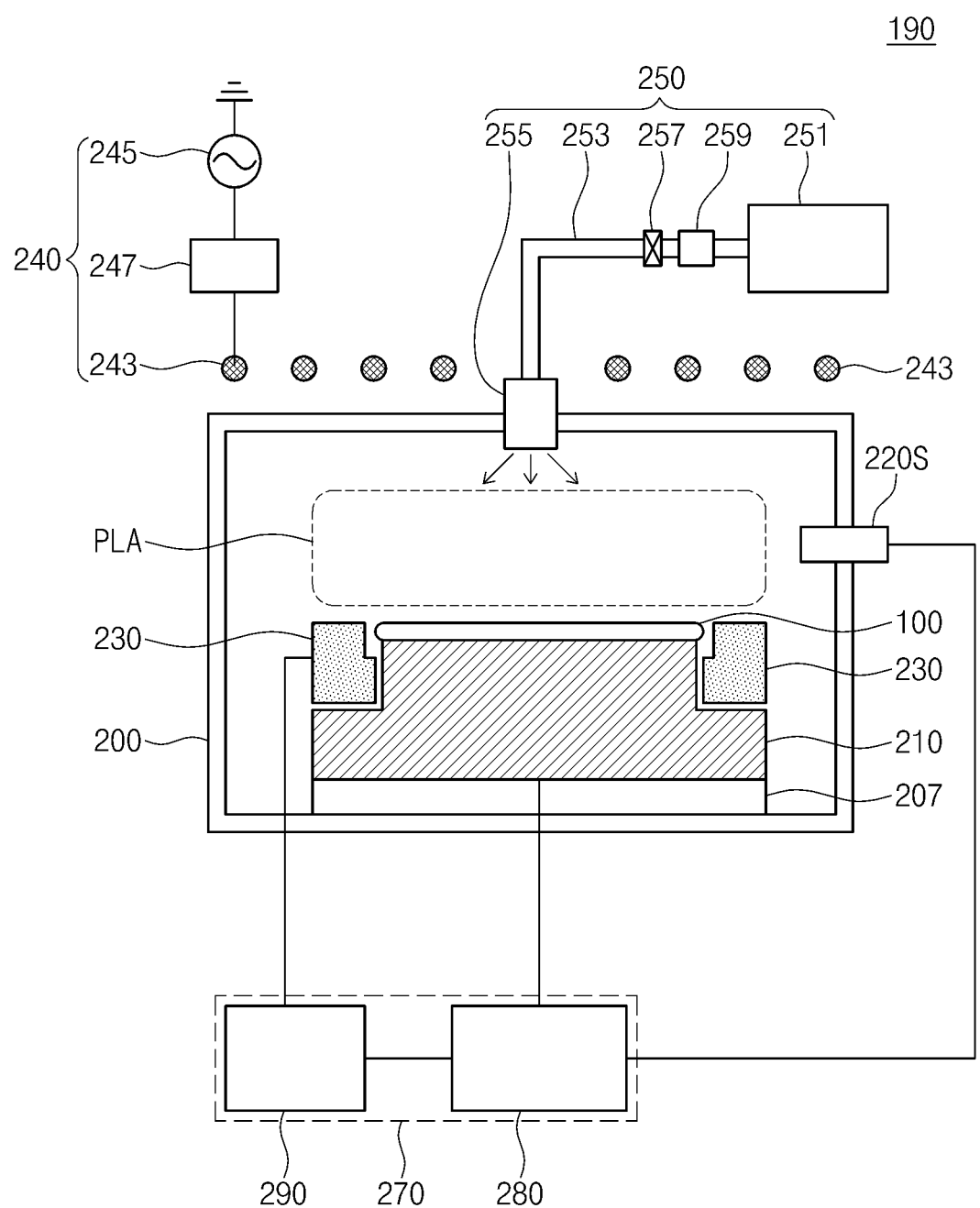
FIG. 1 is a schematic diagram illustrating a plasma apparatus according to some embodiments of the disclosure.

The inventive concepts will now be described more fully hereinafter with reference to the accompanying drawings, in which example embodiments are set forth herein. These example embodiments are just that—examples—and many implementations and variations are possible that do not require the details provided herein. It should also be emphasized that the disclosure provides details of alternative examples, but such listing of alternatives is not exhaustive. Furthermore, any consistency of detail between various examples should not be interpreted as requiring such detail—it is impracticable to list every possible variation for every feature described herein. The language of the claims should be referenced in determining the requirements of the invention.

The terminology used herein is for the purpose of describing particular embodiments only and is not intended to limit the invention. As used herein, the singular terms "a," "an" and "the" are intended to include the plural forms as well, unless the context clearly indicates otherwise. As used herein, the term "and/or" includes any and all combinations of one or more of the associated listed items. It will be understood that when an element is referred to as being "connected" or "coupled" to another element, it may be directly connected or coupled to the other element or intervening elements may be present.

Similarly, it will be understood that when an element such as a layer, region or substrate is referred to as being "on" another element, it can be directly on the other element or intervening elements may be present. In contrast, the term "directly" means that there are no intervening elements. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

Additionally, the embodiment in the detailed description will be described with ideal exemplary views of the inventive concepts. The embodiments of the inventive concepts are not limited to the specific shape illustrated in the exemplary views, but may include other shapes that may be implemented according to manufacturing processes.

It will be also understood that although the terms first, second, third etc. may be used herein to describe various elements, these elements should not be limited by these terms. These terms are only used to distinguish one element from another element. Thus, a first element in some embodiments could be termed a second element in other embodiments without departing from the teachings of the present invention. Exemplary embodiments of aspects of the present disclosure are explained and illustrated herein include their complementary counterparts. The same reference numerals or the same reference designators denote the same elements throughout the specification.

Moreover, exemplary embodiments are described herein with reference to cross-sectional illustrations and/or plane illustrations that may be idealized exemplary illustrations.

Accordingly, deviations from the shapes in the illustrations as a result, for example, of manufacturing techniques and/or tolerances, are to be expected. For example, an etching region illustrated as a rectangle will, typically, have rounded or curved features. Thus, the regions illustrated in the figures may be schematic in nature and their shapes may not illustrate the actual shape of a region of a device.

FIG. 1 is a schematic diagram illustrating a plasma apparatus according to some embodiments of the disclosure.

Referring to FIG. 1, a plasma apparatus 190 according to some embodiments may include a process chamber 200 having an inner, enclosed space, a chuck 210, a plasma generating unit 240, a gas supply unit 250, and a direct current (DC) power generating unit 270.

The process chamber 200 may include a top plate closing a top end of the inner, enclosed space, a bottom plate closing a bottom end of the inner, enclosed space, and a wall portion surrounding the inner, enclosed space. In some embodiments, the top plate of the process chamber 200 may be formed of a ceramic.

The chuck 210 may be disposed within the process chamber 200. The chamber may be a vacuum space. The substrate 100 may be loaded on a top surface of the chuck 210. A predetermined semiconductor process may be performed on the substrate 100 loaded within the process chamber 200. For example, the substrate 100 may be a semiconductor wafer (e.g., a silicon wafer). In some embodiments, the chuck 210 may be an electrostatic chuck. The chuck 210 may be disposed on the bottom plate of the process chamber 200. An insulator 207 may be disposed between the chuck 210 and the bottom plate of the process chamber 200.

A heater (not shown) may be disposed within the chuck 210 to provide heat to the chuck 210 and/or the loaded substrate 100 to raise and/or maintain a target (e.g., predetermined) temperature of the chuck 210 or loaded substrate 100. A heater power generator (not shown) may provide power to the heater, so the heater may generate heat. The power provided to the heater by the heater power generator may be an alternating current (AC) power. A chuck cooler (not shown) may be disposed within the chuck 210. A coolant may be provided into the chuck cooler to cool the chuck 210. A temperature of the chuck 210 may be controlled using the chuck cooler and the heater. A substrate cooling pipe (not shown) may be disposed within the chuck 210. A cooling gas may be provided to a back side of the loaded substrate 100 through the substrate cooling pipe, so a temperature of the loaded substrate 100 may be uniformly maintained. For example, the cooling gas may be a helium (He) gas.

At least a portion of the chuck 210 may be formed of a conductive material and used as an electrode. The DC power generating unit 270 may be electrically connected to the conductive material (i.e., the portions used as the electrode) of the chuck 210. The DC power generating unit 270 will be described in more detail later.

An outer ring 230 may be disposed at an edge of the chuck 210 to surround the loaded substrate 100. A top surface at the edge of the chuck 210 may be lower than a top surface of a central portion of the chuck 210. The outer ring 230 may protect the loaded substrate 210. The outer ring 230 may be adjacent to an edge of the loaded substrate 100.

The gas supply unit 250 provides a process gas into the process chamber 200. In some embodiments, the gas supply unit 250 may include a gas storage part 251 storing the process gas, a gas supply port 255 coupled to the process chamber 200, and a gas supply pipe 253 connected between the gas storage part 251 and the gas supply port 255. The gas supply port 255 may penetrate the top plate of the process chamber 200. The gas supply port 255 may have a nozzle shape or shower-head shape that is installed toward the inner, enclosed space of the process chamber 200. The gas supply unit 250 may further include at least one of a valve 257 and a gas flow controller 259 that are installed on the gas supply pipe 253.

The plasma generating unit 240 may convert the process gas provided in the process chamber 200 into plasma PLA. In some embodiments, the plasma generating unit 240 may include a plasma power generator 245 and an antenna electrode 243 connected to the plasma power generator 245. The plasma power generator 245 may generate and apply a plasma power to the antenna electrode 243. For example, the plasma power may be a radio frequency (RF) power. In some embodiments, a frequency of the plasma power used for generating the plasma PLA may be in a range of 613 MHz to 3200 MHz. For example, the frequency of the plasma power may be in a range of 13.56 MHz for 2040.68 MHz. The antenna electrode 243 may have a closed-loop shape or a coil shape. The plasma PLA may be induced by the plasma power applied to the antenna electrode 243. In addition, the plasma generating unit 240 may further include a matching unit 247 connected between the plasma power generator 245 and the antenna electrode 243. The plasma power may be transmitted from the plasma power generator 245 to the antenna electrode 243 through the matching unit 247. The matching unit 247 may increase transmission efficiency of the plasma power. However, the disclosure is not limited to the plasma generating unit 240 described above. In other embodiments, the plasma generating unit 240 may have another structure capable of generating the plasma PLA.

In some embodiments, an exhaust port (not shown) may be installed at the bottom plate of the process chamber 200. By-products and/or a residual process gas generated during the predetermined semiconductor process may be outputted through the exhaust port. The exhaust port may be connected to an exhaust pump (not shown).

A sensor 220S may be installed to the process chamber 200. For example, the sensor 220S may be installed to the wall portion of the process chamber 200. The inner, enclosed space of the process chamber 200 may be monitored by the sensor 220S. In some embodiments, the sensor 220S may monitor a state of the plasma PLA. In some embodiments, the sensor 220S may monitor the physical quantity of light generated from the plasma PLA. For example, the sensor 220S may sense the intensity of the light generated by the plasma PLA. The sensor 220S may sense the intensity of the light in real time. In some embodiments, the sensor 220S may be an optical emission sensor (OES) capable of sensing the physical quantity of the light. The sensor 220S may be electrically connected to the DC power generating unit 270. The sensor 220S may provide an obtained sensing signal to the DC power generating unit 270. The sensor 220S may provide the sensing signal in real time, including a disturbed sensing signal to reflect disturbances in the light generated by the plasma as they are detected. The sensing signal may be an analog signal.

The DC power generating unit 270 provides a first DC pulse signal having a specific period to the chuck 210. The first DC pulse signal will be described in more detail with reference to FIG. 2A.

Figure 2A:
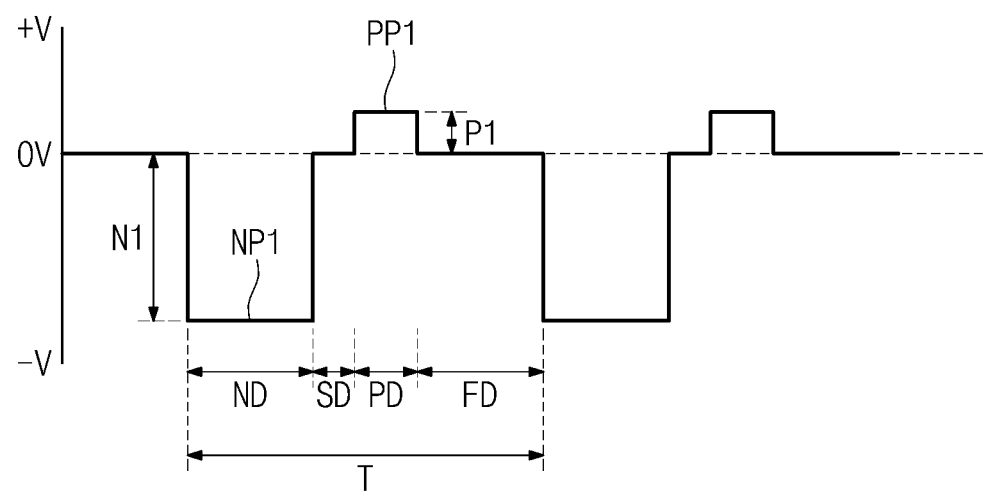
FIG. 2A is a graph illustrating a first direct current (DC) pulse signal that may be applied to a chuck of the plasma apparatus illustrated in FIG. 1.

FIG. 2A is a graph illustrating a first direct current (DC) pulse signal that may be applied to a chuck of the plasma apparatus illustrated in FIG. 1.

Referring to FIGS. 1 and 2A, a period T of the first DC pulse signal may include a negative pulse duration ND during which a first negative pulse NP1 is applied, a positive pulse duration PD during which a first positive pulse PP1 is applied, and a pulse-off duration FD during which the first negative pulse NP1 and the first positive pulse PP1 are turned off. The positive pulse duration PD may be between the negative pulse duration ND and the pulse-off duration FD. In addition, the period T of the first DC pulse signal may further include a stable duration SD that may be between the negative pulse duration ND and the positive pulse duration PD. A ground voltage (e.g., 0V) may be applied to the chuck 210 during at least one of the stable duration SD and the pulse-off duration FD. In some embodiments, the frequency of the period T of the first DC pulse signal may be in a range of 100 Hz to 300 kHz.

In this example, the pulse is turned-off when a ground voltage (e.g., 0V) is applied to the chuck. In other embodiments, a voltage other than the ground voltage may be applied during the pulse off FD and stable duration, and in other embodiments the ground voltage may not be 0V and rather have a DC offset shifting the first and/or second DC pulse signals. For example, the voltages of the first negative pulse NP1, first positive pulse PP1, and voltages during both the stable duration SD and the pulse-off duration FD may all be offset or biased by either a positive or negative reference voltage. For example, one or both of the voltages applied during the stable duration SD and the pulse off duration FD may have a value other than 0V and may range from negative 500V to positive 500V, for example, or, as another example, from negative 100V to positive 100V. The voltage applied during the stable duration SD and the voltage applied during pulse off duration FD may be less positive than the first positive pulse PP1. The voltage applied during the stable duration SD and the voltage applied during pulse off duration FD may be less in magnitude than the magnitude of the first negative pulse NP1.

In some embodiments, the frequency of the period T of the first DC pulse signal may be in a range of 50 Hz to 500 kHz. For example, the first DC pulse signal may have a frequency in a range of 100 Hz to 300 kHz.

In some embodiments, the plasma apparatus 190 may be a dry etching apparatus. However, the disclosure is not limited thereto. In other embodiments, the plasma apparatus 190 may be one of other kinds of semiconductor fabricating apparatuses using the plasma PLA. Hereinafter, the plasma apparatus 190 will be described as a dry etching apparatus for convenience of explanation.

The first negative pulse NP1 is applied to the chuck 210 during the negative pulse duration ND. As a result, positive ions of the plasma PLA are attracted to the substrate 100 (and chuck 210) and formed on substrate 100. In this case, the substrate 100 may be charged by the positive ions. The ground voltage may be applied to the chuck 210 during the stable duration SD, and thus, the plasma PLA and the positive ions may be stabilized during the stable duration SD. The first positive pulse PP1 is applied to the chuck 210 during the positive pulse duration PD that may follow the stable duration SD. Electrons and negative ions of the plasma PLA may be attracted to the substrate 100 (and chuck 210) and formed on substrate 100 as a result of the first positive pulse PP1. Thus, the charged substrate 100 may be neutralized or have its positive charge reduced. As the negative ions and/or electrons of the plasma PLA are attracted and attach to the substrate, the charge of the substrate 100 may be made less positive than it was during the stable duration SD, which may be substantially neutral, or negative. In addition, an electron temperature of the plasma PLA may be increased by during the positive pulse duration. Radicals may be increased in the plasma PLA as a result of the increased electron temperature, and thus, an etch rate and an etch selectivity ratio between materials may be increased (e.g., an etch selectivity ratio of an etch rate of a target layer that is the target of the etch process to an etch rate of a mask on the target layer or a layer exposed to the etchant that is not the target layer).

Characteristics of the radicals may be controlled during the pulse-off duration FD. During the negative pulse duration ND, the plasma may etch portions of the substrate. In some embodiments, the radicals of the plasma may combine with portions of the substrate to generate etch by-products. These etch by products may cause a passivation effect during the pulse-off duration FD. For example, etch by-products may be formed when radicals of the plasma PLA combine with the target material, such as within a via or contact hole of the substrate 100. During the pulse-off duration FD, these etch by-products may escape the via or contact hole of the substrate 100 and be deposited on the upper surface of the substrate 100, which may comprise the upper surface of an etch mask used to etch a pattern into a target layer under the mask. The etch by-products may protect a component used as an etch mask during an etching process, and thus, a process margin of the etching process may be improved. In some embodiments, the amount of the by-products may increase in proportion to an increase in a length (i.e., a time-length) of the pulse-off duration FD. However, the disclosure is not limited thereto. In other embodiments, the amount of the by-products may be substantially constant during the pulse-off duration FD.

Additionally, when an etch region (such as a via or contact hole) having a significant aspect ratio is etched, by-products generated in the etch region may effectively escape from the via/contact hole/etch region during the pulse-off duration FD. The etch by-products in the via/contact hole/etch region may deteriorate a quality of the etching process and/or a profile of the via/contact hole/etch region. However, the by-products generated in the via/contact hole/etch region are provided an opportunity to easily escape from the via/contact hole/etch region during the pulse-off duration FD. Due to a reduced amount of etch by-products in the etch region during a subsequent cycle (e.g., during the next negative pulse duration ND), an etch rate may be increased and/or the via/contact hole/etch region having a more accurate profile may be formed.

A magnitude N1 of the first negative pulse NP1 may be different from a magnitude P1 of the first positive pulse PP1. In some embodiments, the magnitude P1 of the first positive pulse PP1 may be smaller than the magnitude N1 of the first negative pulse NP1. The magnitude P1 of the first positive pulse PP1 may be in a range of 0.1% to 30% of the magnitude N1 of the first negative pulse NP1. For example, the magnitude P1 of the first positive pulse PP1 may be in a range of 1% to 10% of the magnitude N1 of the first negative pulse NP1. In some embodiments, the magnitude N1 of the first negative pulse NP1 may be in a range of 50 V to 10 kV, and the magnitude P1 of the first positive pulse PP1 may be in a range of 15 V to 3 kV.

A length (i.e., a time-length) of the negative pulse duration ND may be different from a length (i.e., a time-length) of the positive pulse duration PD. In some embodiments, the negative pulse duration ND may be longer than the positive pulse duration PD. In some embodiments, the length of the negative pulse duration ND may be in a range of 1 microsecond (μ) to 200 μs, and the length of the positive pulse duration PD may be in a range of 1 μs to 150 μs. The negative duration ND may be less than the duration of the period T minus the negative duration (e.g., ND<SD+PD+FD). In addition, the negative duration ND may be less than the pulse off duration FD (i.e., ND<FD).

A length of the pulse-off duration FD may be different from a length of the stable duration SD. In some embodiments, the pulse-off duration FD may be longer than the stable duration SD, such as more than twice as long, more than three times as long, more than ten times as long or even more than 100 times as long. Alternatively, the pulse-off duration FD may be shorter than the stable duration SD. In some embodiments, the length of the stable duration SD may be in a range of 1 μs to 30 μs, and the length of the pulse-off duration FD may be in a range of 100 nano-seconds (ns) to 9.5 milli-seconds (ms).

Referring again to FIG. 1, the DC power generating unit 270 may include a first DC power generator 280 that applies the first DC pulse signal to the chuck 210. In some embodiments, the sensor 220S may be electrically connected to the first DC power generator 280.

Figure 2B:
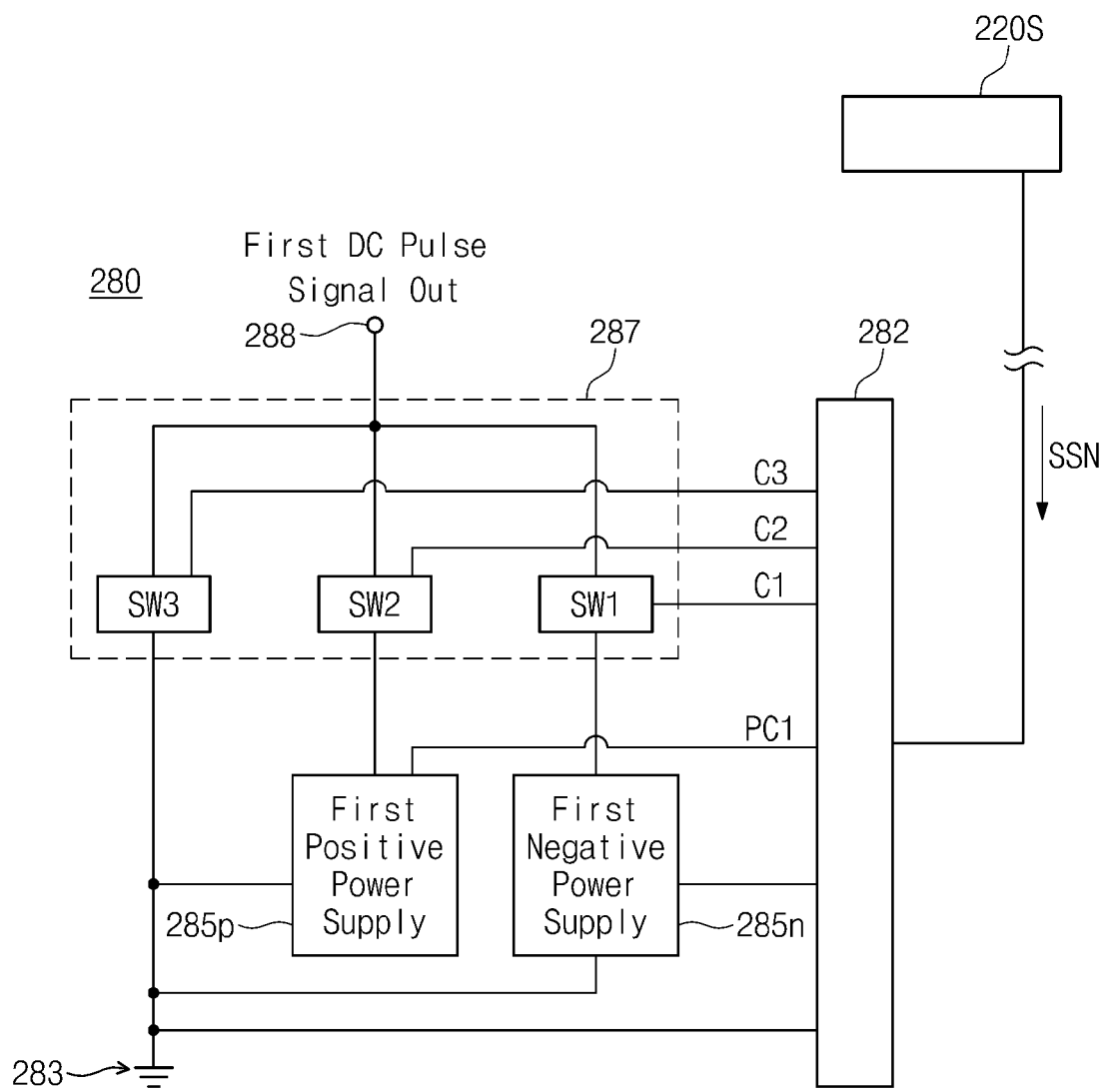
FIG. 2B is a schematic diagram illustrating an embodiment of a first DC power generator that may be in the plasma apparatus illustrated in FIG. 1.

An embodiment of the first DC power generator 280 will be described in more detail with reference to FIG. 2B. FIG. 2B is a schematic diagram illustrating an exemplary embodiment of a first DC power generator that may be in the plasma apparatus illustrated in FIG. 1.

Referring to FIGS. 1, 2A, and 2B, the first DC power generator 280 may include a first negative power supply 285n generating the first negative pulse NP1, a first positive power supply 285p generating the first positive pulse PP1, and a first ground source 283 generating a ground voltage. The first positive power supply 285p may be operated independently of the first negative power supply 285n. The first DC power generator 280 may further include a first pulse modulator 287 controlling output times of the first negative pulse NP1 and the first positive pulse PP 1. In addition, the first DC power generator 280 may further include a first controller 282 that controls operations of the power supplies 285n and 285p and the first pulse modulator 287.

The first controller 282 may be electrically connected to the sensor 220S, so the first controller 282 may receive a sensing signal SSN from the sensor 220S.

In some embodiments, the first pulse modulator 287 may include first, second and third switches SW1, SW2 and SW3. First terminals of the first, second and third switches SW1, SW2 and SW3 may be connected to the first negative power supply 285n, the first positive power supply 285p, and the first ground source 283, respectively. Second terminals of the first, second and third switches SW1, SW2 and SW3 may each be connected to a first output terminal 288 of the first pulse modulator 287. The first controller 282 may provide the first, second and third switches SW1, SW2 and SW3 with first, second and third control signals C1, C2 and C3, respectively, so as to output the first DC pulse signal through the first output terminal 288.

The first negative power supply 285n and the first positive power supply 285p may continuously output the first negative pulse NP1 and the first positive pulse PP1 as part of the first DC power generator 280 outputting the first DC pulse signal. The first controller 282 may provide the first control signal C1 to the first switch SW1 during the negative pulse duration ND, enabling the first switch SW1 to turn-on. While C1 is being provided, the second and third control signals C2 and C3 may be interrupted to turn-off the second and third switches SW2 and SW3. Thus, the first negative pulse NP1 may be applied from the first negative power supply 285n to the chuck 210 through the first switch SW1 and the first output terminal 288 during the negative pulse duration ND.

The first controller 282 may provide the third control signal C3 to the third switch SW3 during the stable duration SD, enabling the third switch SW3 to turn-on. While C3 is being provided, the first and second control signals C1 and C2 may be interrupted to turn-off the first and second switches SW1 and SW2. Thus, the ground voltage or a reference voltage (i.e. DC offset, not shown) may be applied from the first ground source 283 to the chuck 210 through the third switch SW3 and the first output terminal 288 during the stable duration SD.

The first controller 282 may provide the second control signal C2 to the second switch SW2 during the positive pulse duration PD, enabling the second switch SW2 to turn-on. While C2 is being provided, the first and third control signals C1 and C3 may be interrupted to turn-off the first and third switches SW1 and SW3. Thus, the first positive pulse PP1 may be applied from the first positive power supply 285p to the chuck 210 through the second switch SW2 and the first output terminal 288 during the positive pulse duration PD. Control of the second control signal C2 may extend or shorten the time length of the positive pulse duration PD.

The first controller 282 may provide the third control signal C3 to the third switch SW3 during the pulse-off duration FD, enabling the third switch SW3 to turn-on. While C3 is being provided, the first and second control signals C1 and C2 may be interrupted to turn-off the first and second switches SW1 and SW2. Thus, the ground voltage may be applied from the first ground source 283 to the chuck 210 through the third switch SW3 and the first output terminal 288 during the pulse-off duration FD.

In some embodiments, the first controller 282 may provide a first positive control signal PC1 to the first positive power supply 285p. The first controller 282 may control the magnitude P1 of the first positive pulse PP1 generated from the first positive power supply 285p by means of the first positive control signal PC1.

As described above, the first controller 282 may be electrically connected to the sensor 220S so as to receive the sensing signal SSN. The first controller 282 may control at least one of the first pulse modulator 287 and the first positive power supply 285p in response to the sensing signal SSN. In some embodiments, in response to the sensing signal SSN, the first controller 282 may control the first pulse modulator 287 to adjust the length of the positive pulse duration PD and/or the first positive power supply 285p to adjust the magnitude P1 of the first positive pulse PP1. In other words, the first controller 282 may change at least one of the length of the positive pulse duration PD and the magnitude P1 of the first positive pulse PP1 in response to the sensing signal SSN.

In some embodiments, the sensing signal SSN may be the analog signal, as described above. In this case, the first controller 282 may include an analog-digital convertor that converts the sensing signal SSN into a digital signal.

A method of operating the plasma apparatus 190 will be described in more detail with reference to the following drawings. FIG. 3 is a flowchart illustrating a method of operating a plasma apparatus according to some embodiments of the disclosure. FIGS. 4A to 4C and 5A to 5C are graphs illustrating an exemplary method of operating a plasma apparatus according to some embodiments of the disclosure.

Referring to FIGS. 1, 2B, and 3, the substrate 100 may be loaded on the top surface of the chuck 210. The process gas may be supplied into the process chamber 200 through the gas supply unit 250. The plasma generating unit 240 may provide the plasma power to generate the plasma PLA over the chuck 210 in the process chamber 200 (S500).

The state of the plasma PLA may be monitored through the sensor 220S (S510). In some embodiments, the sensor 220S may sense the intensity of light generated by the plasma PLA, as described above. As illustrated in FIG. 2B, the sensor 220S may provide the obtained sensing signal SSN to the first controller 282 of the first DC power generator 280.

The first DC pulse signal may be applied to the chuck 210 by the first DC power generator 280 to perform the predetermined semiconductor process (S520). The sensor 220S may monitor the state of the plasma PLA in real time during application of the first DC pulse signal.

Figure 4A:
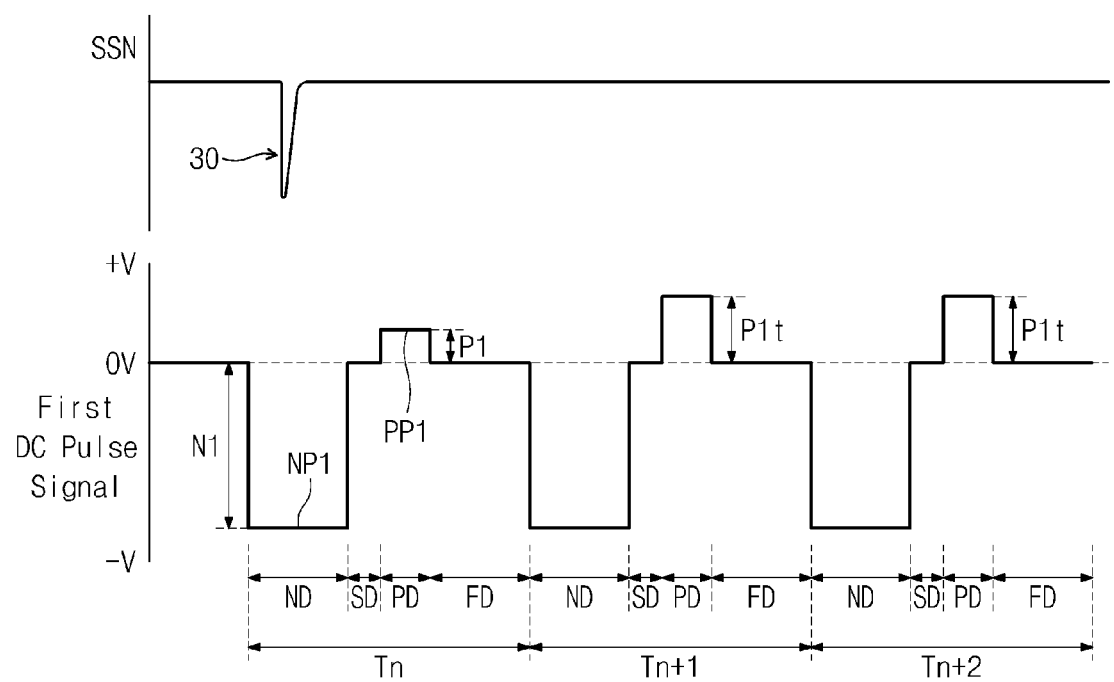
FIGS. 4A to 4C and 5A to 5C are graphs illustrating an exemplary method of operating a plasma apparatus according to some embodiments of the disclosure.
Figure 4B:
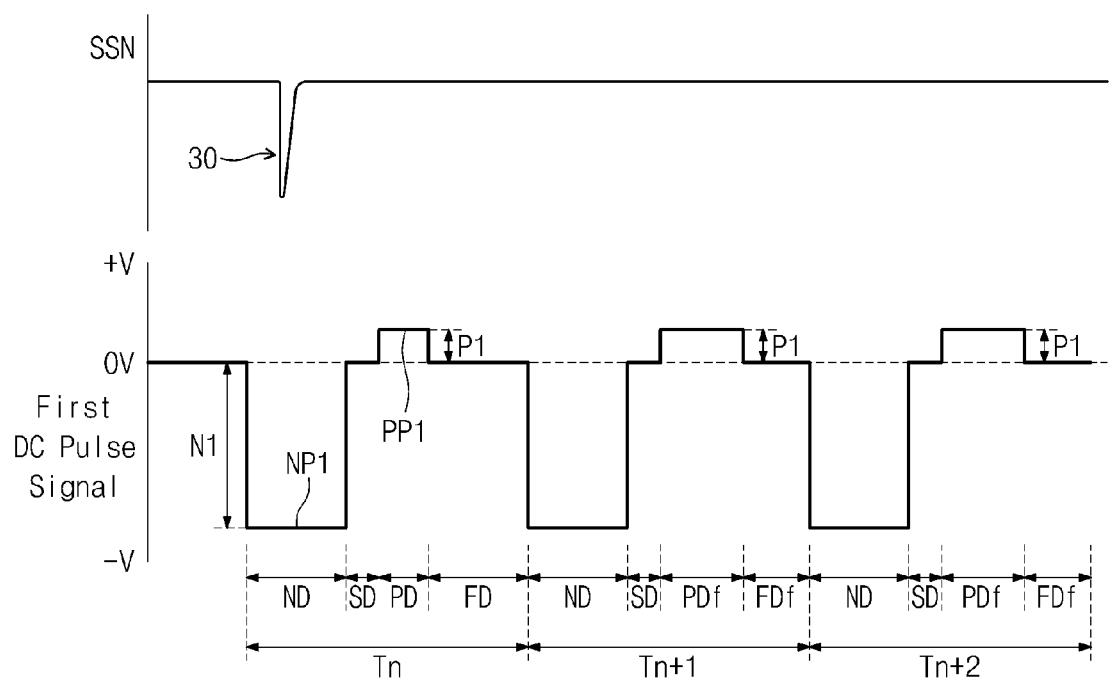
Figure 4C:
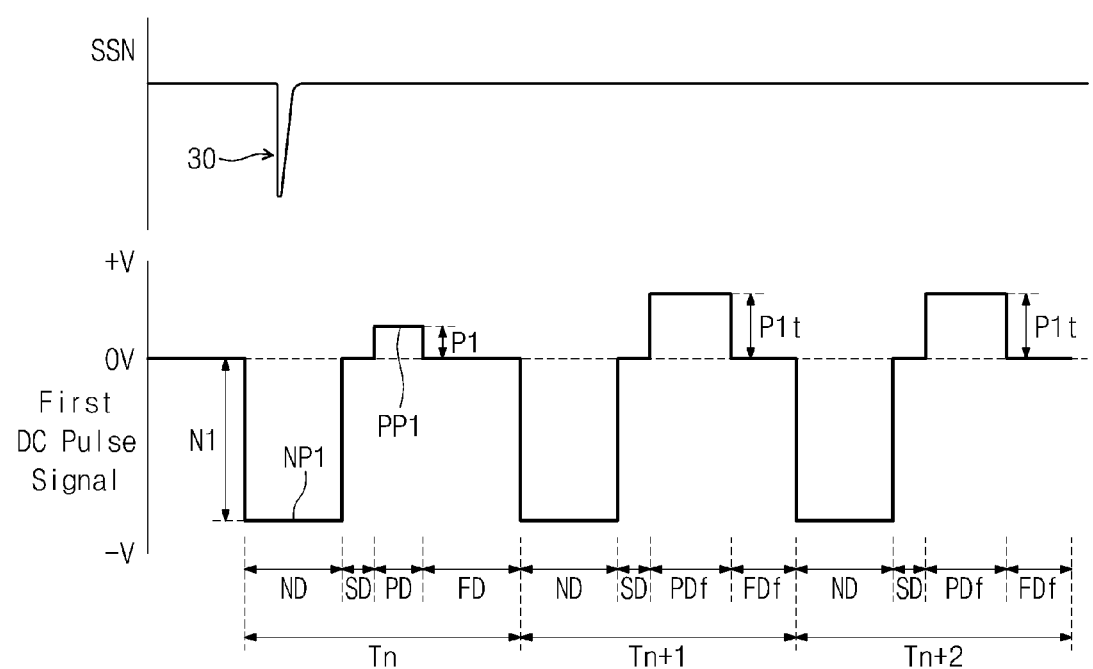

First controller 282 may monitor the sensing signal SSN provided by sensor 220S and determine whether a signal disturbance (see, e.g., reference numeral 30 of FIGS. 4A to 4C and 5A to 5C) has occurred or not. In FIGS. 4A-4C, e.g., the signal disturbance incident is reflected in a disturbance of the sensing signal SSN in an $n^{th}$ period of the first DC pulse signal (S530), where "n" denotes a natural number. In some embodiments, the first controller 282 may determine whether the signal disturbance occurs in the $n^{th}$ period of the first DC pulse signal.

If the signal disturbance of the sensing signal SSN occurs in the $n^{th}$ period of the first DC pulse signal, the first DC power generator 280 may change at least one of the magnitude of the first positive pulse and the length of the positive pulse duration of an n+1$^{th}$ period of the first DC pulse signal (S540). In some embodiments, the magnitude of the first negative pulse and the length of the negative pulse duration of the n+1$^{th}$ period may be equal to the magnitude of the first negative pulse and the length of the negative pulse duration of the $n^{th}$ period, respectively. In other words, the magnitude of the first negative pulse and the length of the negative pulse duration may be constant and remain unchanged in the periods of the first DC pulse signal subsequent to detecting the disturbance in the nth period to perform the predetermined semiconductor process. The step S540 will be described in more detail with reference to FIGS. 4A to 4C and 5A to 5C.

In some embodiments, as illustrated in FIGS. 4A to 4C, the signal disturbance 30 of the sensing signal SSN may occur in the negative pulse duration ND of the $n^{th}$ period Tn. In this case, positive ions which are moved toward the substrate 100 by a high voltage of the first negative pulse NP1 may affect the signal disturbance 30. If the signal disturbance 30 occurs in the negative pulse duration ND of the $n^{th}$ period Tn, at least one of the magnitude of the first positive pulse and the length of the positive pulse duration of the n+1$^{th}$ period Tn+1 may be increased by the first DC power generator 280 in the step S540 as compared to at least one of the magnitude of the first positive pulse and the length of the positive pulse duration PD of the $n^{th}$ period Tn. Thus, the amount of electrons and/or negative ions moved towards the chuck 210 or substrate 100 during the positive pulse duration of the n+1$^{th}$ period Tn+1 may be increased to minimize or prevent the signal disturbance 30 caused by positive ions of the negative pulse duration.

In some embodiments, as illustrated in FIG. 4A, the first DC power generator 280 may control the first positive power supply 285p in the step S540 such that the magnitude P1t of the first positive pulse PP1 of the n+1$^{th}$ period Tn+1 may be increased as compared to the magnitude P1 of the first positive pulse PP1 of the $n^{th}$ period Tn. The length of the positive pulse duration PD of the n+1$^{th}$ period Tn+1 may be controlled to remain equal to the length of the positive pulse duration PD of the $n^{th}$ period Tn. As described above, the magnitude N1 of the first negative pulse NP1 may be greater than the magnitude P1 of the first positive pulse PP1 in the $n^{th}$ period Tn. Likewise, the magnitude N1 of the first negative pulse NP1 may be greater than the increased magnitude P1t of the first positive pulse PP1 in the n+1$^{th}$ period Tn+1. The length of the stable duration SD of the n+1$^{th}$ period Tn+1 may be different from the length of the pulse-off duration FD of the n+1$^{th}$ period Tn+1. In FIG. 4A, a magnitude of a first positive pulse and a length of a positive pulse duration of an n+2$^{th}$ period Tn+2 may be equal to those of the n+1$^{th}$ period Tn+1, respectively.

In other embodiments, as illustrated in FIG. 4B, the first controller 282 of the first DC power generator 280 may control the first pulse modulator 287 in the step S540 such that the length of the positive pulse duration PDf of the n+1$^{th}$ period Tn+1 is increased as compared to the length of the positive pulse duration PD of the $n^{th}$ period Tn. In this example, the magnitude P1 of the first positive pulse PP1 of the n+1$^{th}$ period Tn+1 may be equal to the magnitude P1 of the first positive pulse PP1 of the $n^{th}$ period Tn. Even though the length of the positive pulse duration PDf of the n+1$^{th}$ period Tn+1 is increased, a total length of the n+1$^{th}$ period Tn+1 may be equal to a total length of $n^{th}$ period Tn. Thus, a length of a pulse-off duration FDf of the n+1$^{th}$ period Tn+1 may be reduced by a difference between the length of the positive pulse duration PDf of the n+1$^{th}$ period Tn+1 and the length of the positive pulse duration PD of the $n^{th}$ period Tn. In this case, the length of the pulse-off duration FDf of the n+1$^{th}$ period Tn+1 may also be different from the length of the stable duration SD of the n+1$^{th}$ period Tn+1. In FIG. 4B, the magnitude of the first positive pulse and the length of the positive pulse duration of the n+2$^{th}$ period Tn+2 may be equal to those of the n+1$^{th}$ period Tn+1, respectively.

In still other embodiments, as illustrated in FIG. 4C, the magnitude P1t of the first positive pulse and the length of the positive pulse duration PDf of the n+1$^{th}$ period Tn+1 may both be increased by the first DC power generator 280 in the step S540 as compared to the magnitude P1 of the first positive pulse and the length of the positive pulse duration PD of the $n^{th}$ period Tn. In this case, the total length of the n+1$^{th}$ period Tn+1 may be equal to the total length of the $n^{th}$ period Tn. Thus, the length of the pulse-off duration FDf of the n+1$^{th}$ period Tn+1 may be reduced as compared to the length of the pulse-off duration FD of the $n^{th}$ period Tn. In FIG. 4C, the magnitude of the first positive pulse and the length of the positive pulse duration of the n+2$^{th}$ period Tn+2 may be equal to those of the n+1$^{th}$ period Tn+1, respectively.

Figure 5A:
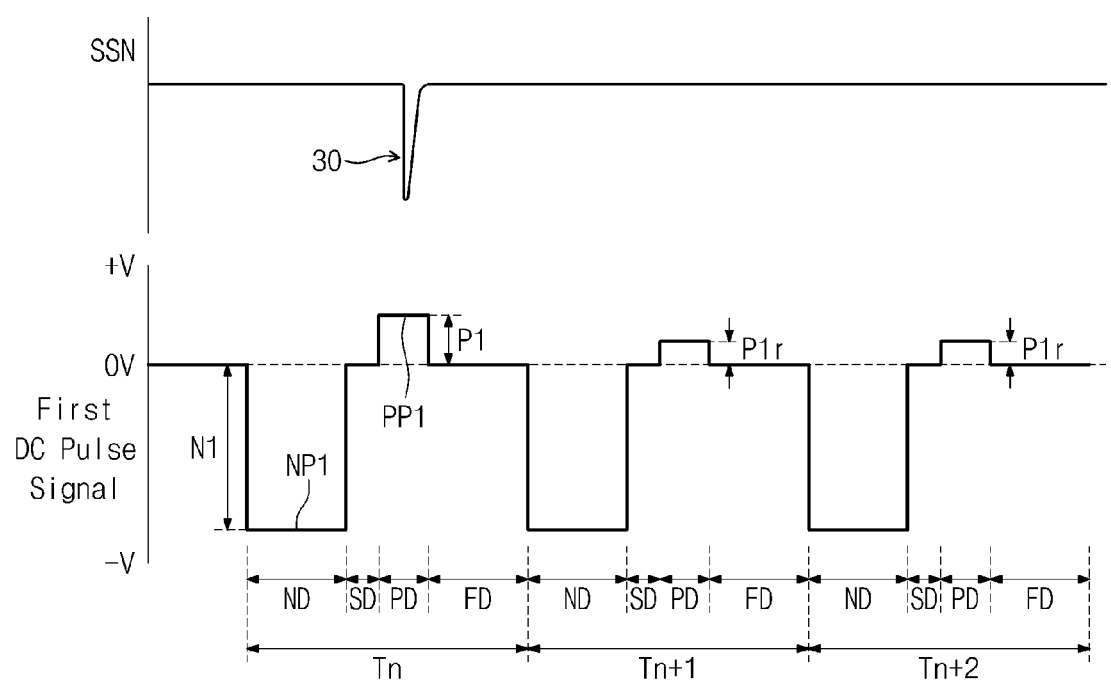
Figure 5B:
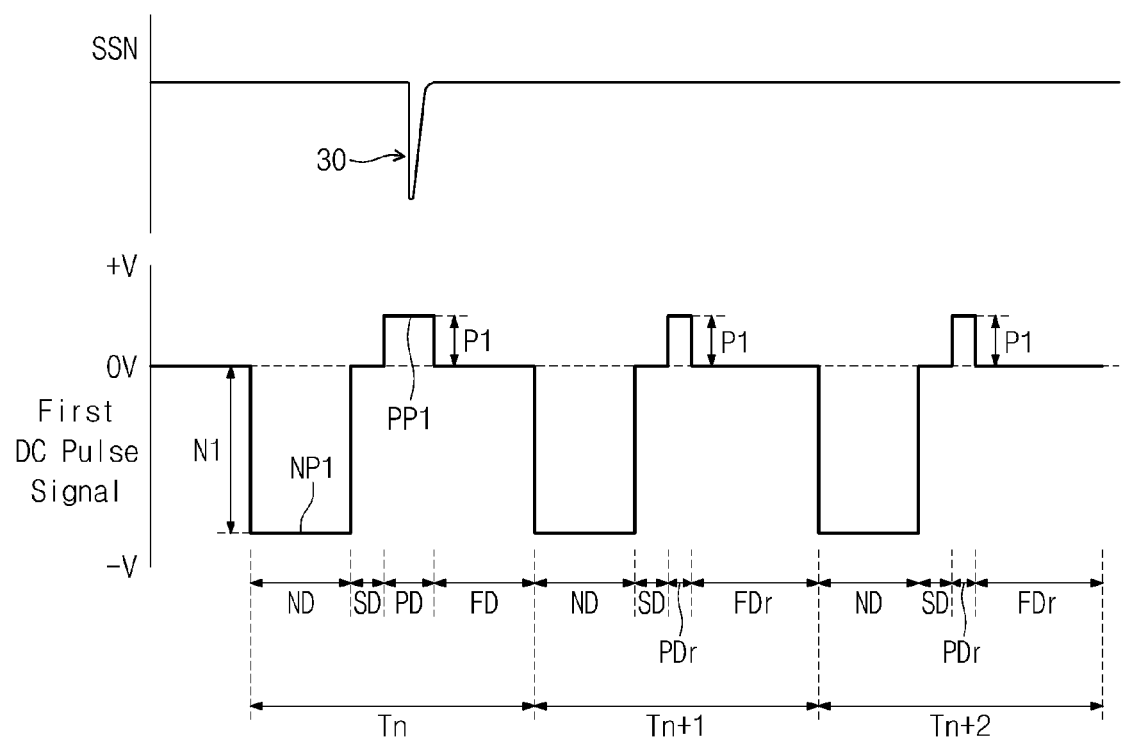
Figure 5C:
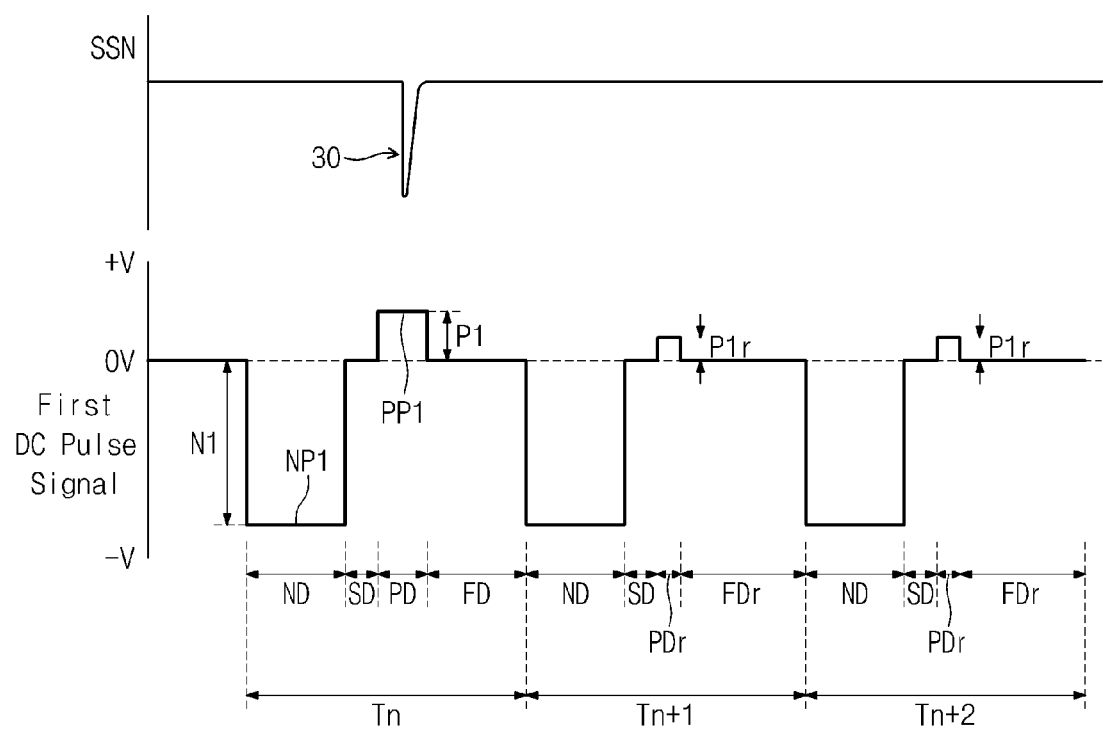

On the other hand, as illustrated in FIGS. 5A to 5C, the signal disturbance 30 of the sensing signal SSN may occur in the positive pulse duration PD of the $n^{th}$ period Tn. In this case, electrons moved by the first positive pulse PP1 may affect the signal disturbance 30. If the signal disturbance 30 occurs in the positive pulse duration PD of the $n^{th}$ period Tn, at least one of the magnitude of the first positive pulse and the length of the positive pulse duration of the n+1$^{th}$ period Tn+1 may be reduced by the first DC power generator 280 in the step S540 as compared to at least one of the magnitude of the first positive pulse and the length of the positive pulse duration of the $n^{th}$ period Tn. Thus, the amount of electrons and/or negative ions moved towards the chuck 210 or substrate 100 during the positive pulse duration of the n+1$^{th}$ period Tn+1 may be reduced to minimize or prevent the signal disturbance 30.

In some embodiments, as illustrated in FIG. 5A, the first DC power generator 280 may control the first positive power supply 285p in the step S540 such that the magnitude P1r of the first positive pulse PP1 of the n+1$^{th}$ period Tn+1 is reduced as compared to the magnitude P1 of the first positive pulse PP1 of the n$^{th}$ period Tn. In this example, the length of the positive pulse duration PD of the n+1$^{th}$ period Tn+1 may be equal to the length of the positive pulse duration PD of the n$^{th}$ period Tn. With the magnitude P1r of the first positive pulse of the n+1$^{th}$ period Tn+1 reduced, the magnitude N1 of the first negative pulse of the n+1$^{th}$ period Tn+1 may still be greater than the magnitude P1r of the first positive pulse. As illustrated in FIG. 5A, the magnitude of the first positive pulse and the length of the positive pulse duration of the n+2$^{th}$ period Tn+2 may be equal to those of the n+1$^{th}$ period Tn+1, respectively.

In other embodiments, as illustrated in FIG. 5B, the first controller 282 of the first DC power generator 280 may control the first pulse modulator 287 in the step S540 such that the length of the positive pulse duration PDr of the n+1$^{th}$ period Tn+1 is reduced as compared to the length of the positive pulse duration PD of the n$^{th}$ period Tn. In this example, the magnitude P1 of the first positive pulse PP1 of the n+1$^{th}$ period Tn+1 may be equal to the magnitude P1 of the first positive pulse PP1 of the n$^{th}$ period Tn. Even though the length of the positive pulse duration PDr of the n+1$^{th}$ period Tn+1 may be reduced, the total length of the n+1$^{th}$ period Tn+1 may be equal to the total length of n$^{th}$ period Tn. Thus, a length of a pulse-off duration FDr of the n+1$^{th}$ period Tn+1 may be increased by a difference between the length of the positive pulse duration PDr of the n+1$^{th}$ period Tn+1 and the length of the positive pulse duration PD of the n$^{th}$ period Tn. In this case, the length of the pulse-off duration FDr of the n+1$^{th}$ period Tn+1 may also be different from the length of the stable duration SD of the n+1$^{th}$ period Tn+1. As illustrated in FIG. 5B, the magnitude of the first positive pulse and the length of the positive pulse duration of the n+2$^{th}$ period Tn+2 may be equal to those of the n+1$^{th}$ period Tn+1, respectively.

In still other embodiments, as illustrated in FIG. 5C, the magnitude P1r of the first positive pulse and the length of the positive pulse duration PDr of the n+1$^{th}$ period Tn+1 may both be reduced by the first DC power generator 280 in the step S540 as compared to the magnitude P1 of the first positive pulse and the length of the positive pulse duration PD of the n$^{th}$ period Tn. In this case, the total length of the n+1$^{th}$ period Tn+1 may be equal to the total length of the n$^{th}$ period Tn. Thus, the length of the pulse-off duration FDr of the n+1$^{th}$ period Tn+1 may be increased. As illustrated in FIG. 5C, the magnitude of the first positive pulse and the length of the positive pulse duration of the n+2$^{th}$ period Tn+2 may be equal to those of the n+1$^{th}$ period Tn+1, respectively.

The signal disturbance 30 may be minimized or prevented in the n+1$^{th}$ period Tn+1 by one of the operating methods described above, and thus, disturbance of the plasma (e.g., an arching phenomenon of the plasma) and a resulting signal disturbance 30 may be prevented. The reliability of the semiconductor manufacturing process performed using the plasma apparatus 190 may thus be improved.

If the signal disturbance 30 of the sensing signal SSN does not occur in the n$^{th}$ period Tn in the step S530, the n+1$^{th}$ period Tn+1 of the first DC pulse signal may be performed under the same conditions as the n$^{th}$ period Tn (S550). If no significant disturbance of the plasma is detected, then the DC power generator 280 may continue to output the same DC pulse signals in consecutive time periods and may continue to do so until a disturbance is detected. The flowchart of FIG. 3 therefore returns to the S500 state after completion of either the S540 or the S550 step.

Referring again to FIG. 1, a second DC pulse signal may be applied to the outer ring 230. In some embodiments, the DC power generating unit 270 may further include a second DC power generator 290 that applies the second DC pulse signal to the outer ring 230. These will be described in more detail with reference to FIGS. 6 and 7.

Figure 6:
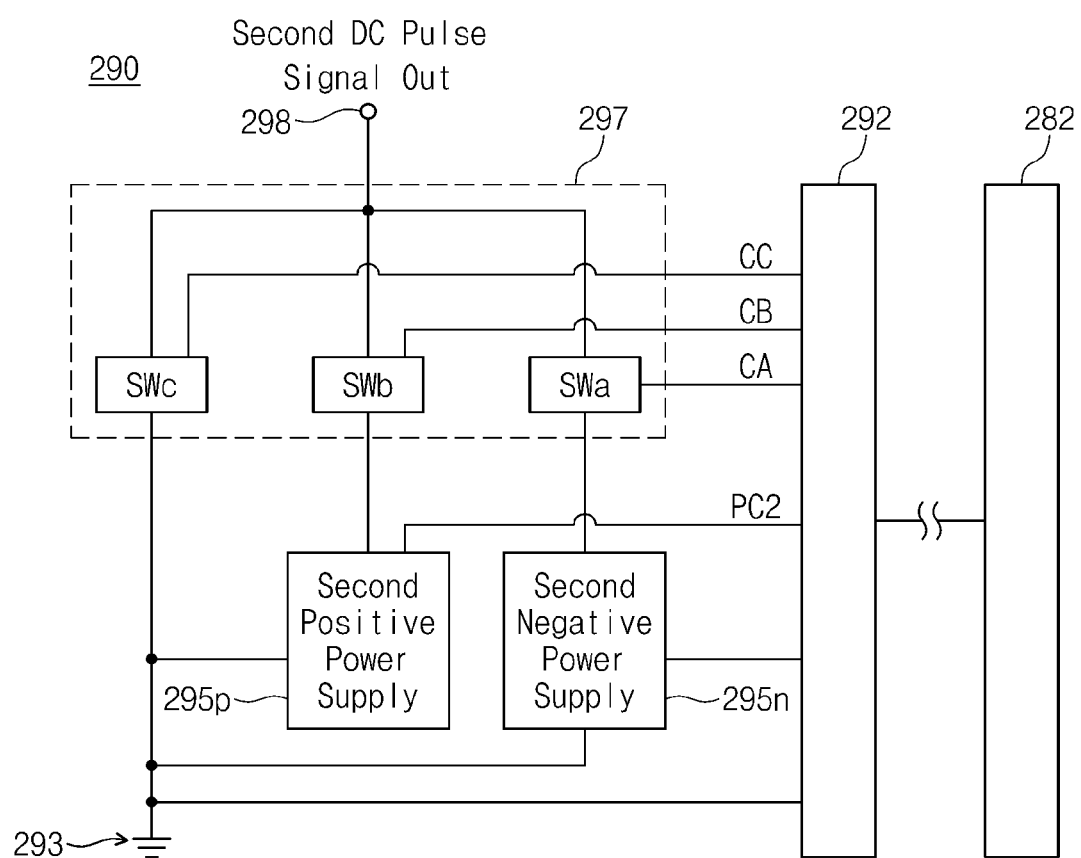
FIG. 6 is a schematic diagram illustrating an embodiment of a second DC power generator that may be included in the plasma apparatus illustrated in FIG. 1.
Figure 7:
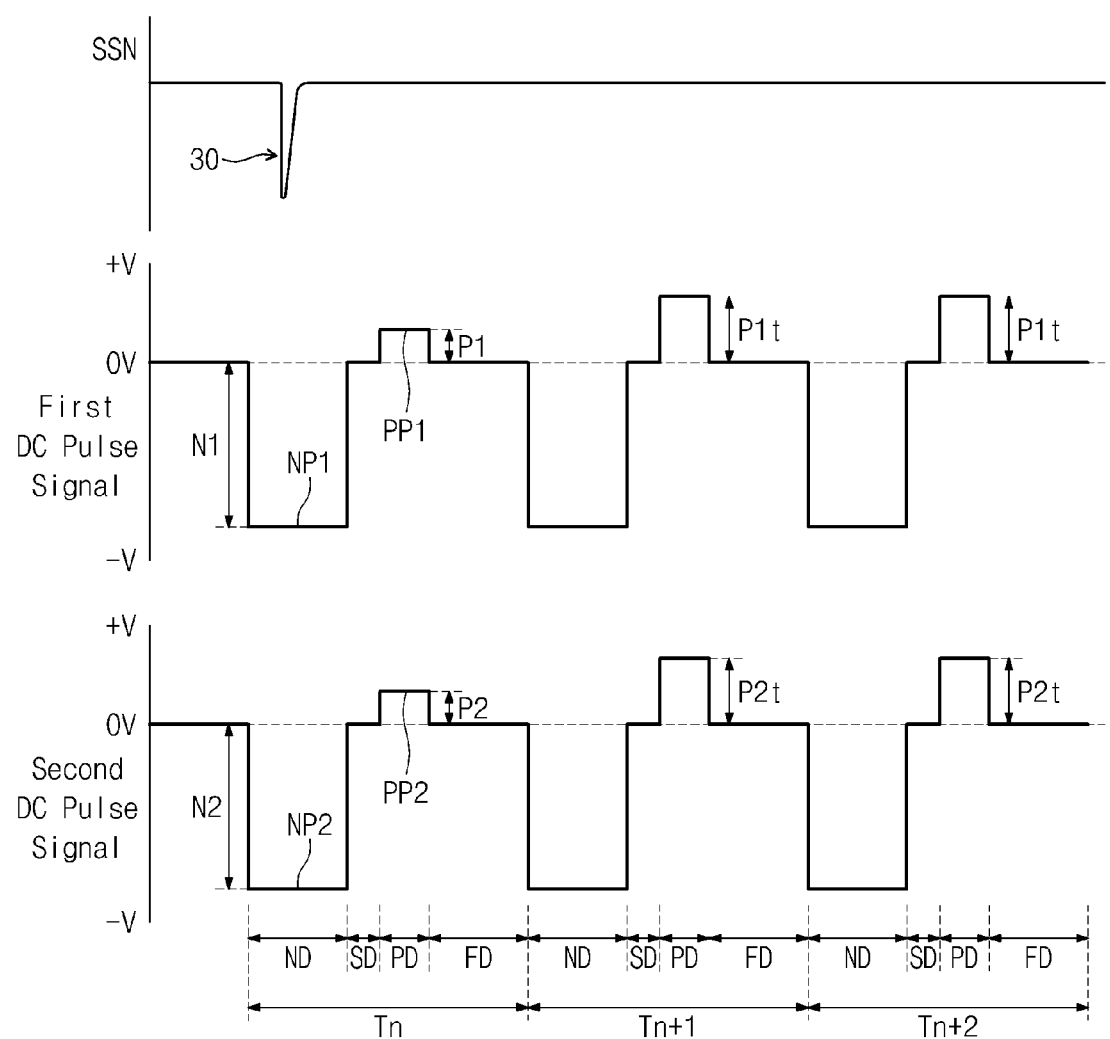
FIG. 7 is a graph illustrating an exemplary method of operating first and second DC power generators and a sensor, all of which may be included in the plasma apparatus illustrated in FIG. 1.

FIG. 6 is a schematic diagram illustrating an embodiment of a second DC power generator that may be included in the plasma apparatus illustrated in FIG. 1. FIG. 7 is a graph illustrating an exemplary method of operating first and second DC power generators and a sensor, all of which may be included in the plasma apparatus illustrated in FIG. 1.

Referring to FIGS. 1 and 7, each period of the second DC pulse signal may be the same as each period of the first DC pulse signal. The first and second DC pulse signals may be applied to the chuck 210 and the outer ring 230 at the same time. The second DC pulse signal may be synchronized with the first DC pulse signal. The second DC pulse signal may apply a second negative pulse NP2 to the outer ring 230 during the negative pulse duration ND and may apply a second positive pulse PP2 to the outer ring 230 during the positive pulse duration PD. The second DC pulse signal may apply the ground voltage to the outer ring 230 during the stable duration SD and the pulse-off duration FD. Since the second DC pulse signal is applied to the outer ring 230, an electric field which would have otherwise concentrated at an edge of the loaded substrate 100 may be relieved to improve a process uniformity (e.g., a uniformity of an etch rate) of the loaded substrate 100.

Referring to FIGS. 1, 2B, 6, and 7, the second DC power generator 290 may include a second negative power supply 295n generating the second negative pulse NP2, a second positive power supply 295p generating the second positive pulse PP2, a second pulse modulator 297 controlling output times of the second negative pulse NP2 and the second positive pulse PP2, and a second ground source 293 generating a ground voltage. In addition, the second DC power generator 290 may further include a second controller 292 controlling operations of the power supplies 295n and 295p and the second pulse modulator 297.

In some embodiments, the second pulse modulator 297 may include first, second and third switches SWa, SWb and SWc. First terminals of the first, second and third switches SWa, SWb and SWc may be connected to the second negative power supply 295n, the second positive power supply 295p, and the second ground source 293, respectively. Second terminals of the first, second and third switches SWa, SWb and SWc may each be connected to a second output terminal 298 of the second pulse modulator 297.

The second controller 292 may provide the first, second and third switches SWa, SWb and SWc with first, second and third control signals CA, CB and CC to output the second DC pulse signal through the second output terminal 298. In addition, the second controller 292 may provide the second positive power supply 295p with a second positive control signal PC2 to control a magnitude P2 of the second positive pulse PP2. A method of operating the second DC power generator 290 may be the same as the method of operating the first DC power generator 280 described with reference to FIG. 2B.

The second controller 292 may be electrically connected to the first controller 282 of the first DC power generator 280. The second controller 292 may be synchronized with the first controller 282. Thus, at least one of the magnitude of the second positive pulse and the length of the positive pulse duration of an $n+1^{th}$ period Tn+1 of the second DC pulse signal may be changed when at least one of the magnitude of the first positive pulse and the length of the positive pulse duration of the $n+1^{th}$ period Tn+1 of the first DC pulse signal is changed in, for example, the step S540 of FIG. 3. Synchronization may be formed by making the turn-on and turn-off times of the first and second DC pulse signals substantially the same. FIG. 7 illustrates a changed magnitude P2t of the second positive pulse PP2 of the $n+1^{th}$ period Tn+1 of the second DC pulse signal as compared to the second positive pulse PP2 of the $n^{th}$ period Tn. The second DC pulse signal may also be changed like the first DC pulse signal illustrated in any one of FIGS. 4B, 4C, 5A, 5B, and 5C.

A magnitude N2 of the second negative pulse NP2 may be equal to or different from the magnitude N1 of the first negative pulse NP1. The magnitude P2 of the second positive pulse PP2 may be equal to or different from the magnitude P1 of the first positive pulse PP1.

Figure 8:
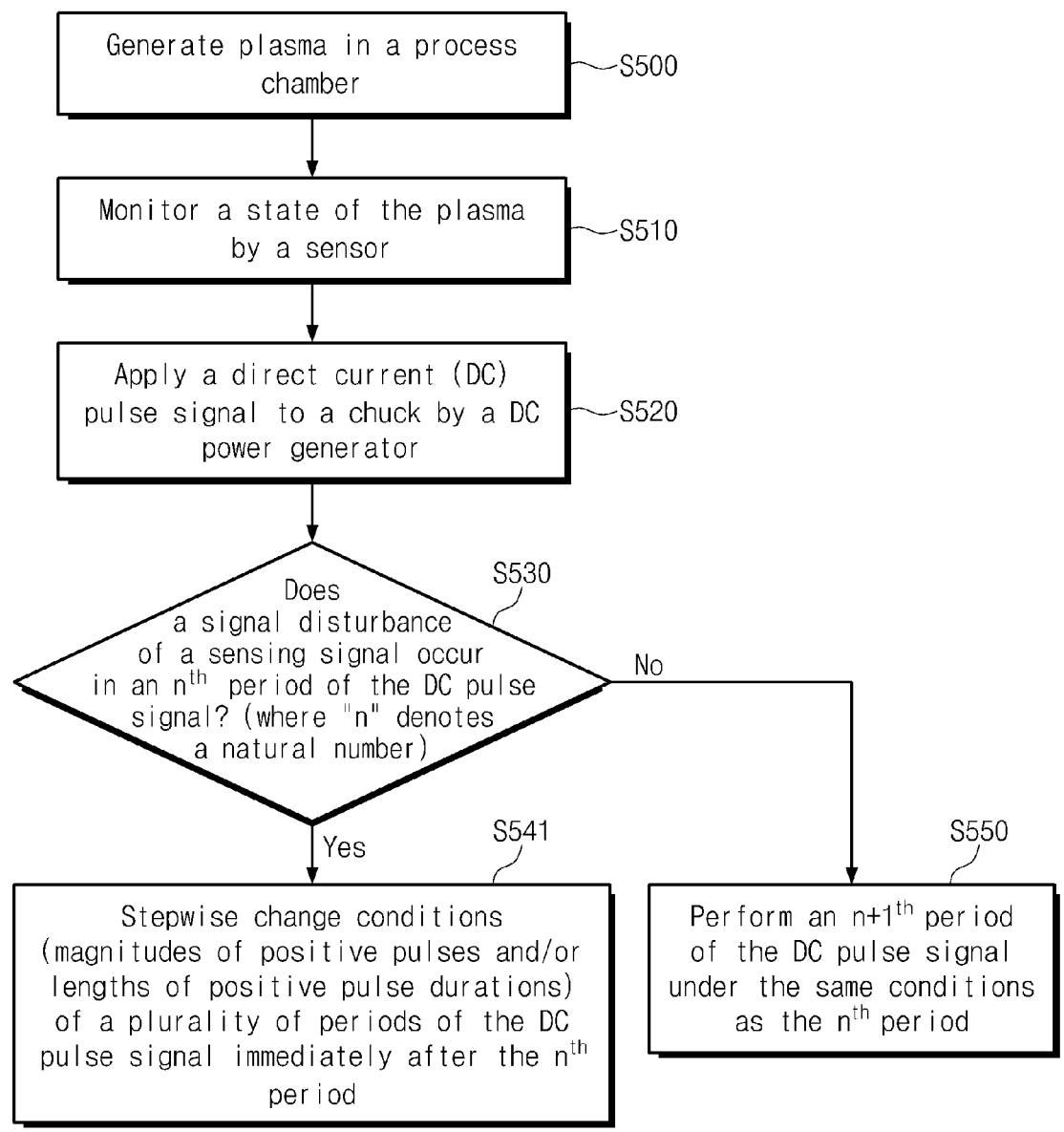
FIG. 8 is a flowchart illustrating an exemplary method of operating a plasma apparatus according to other embodiments of the disclosure.
Figure 9A:
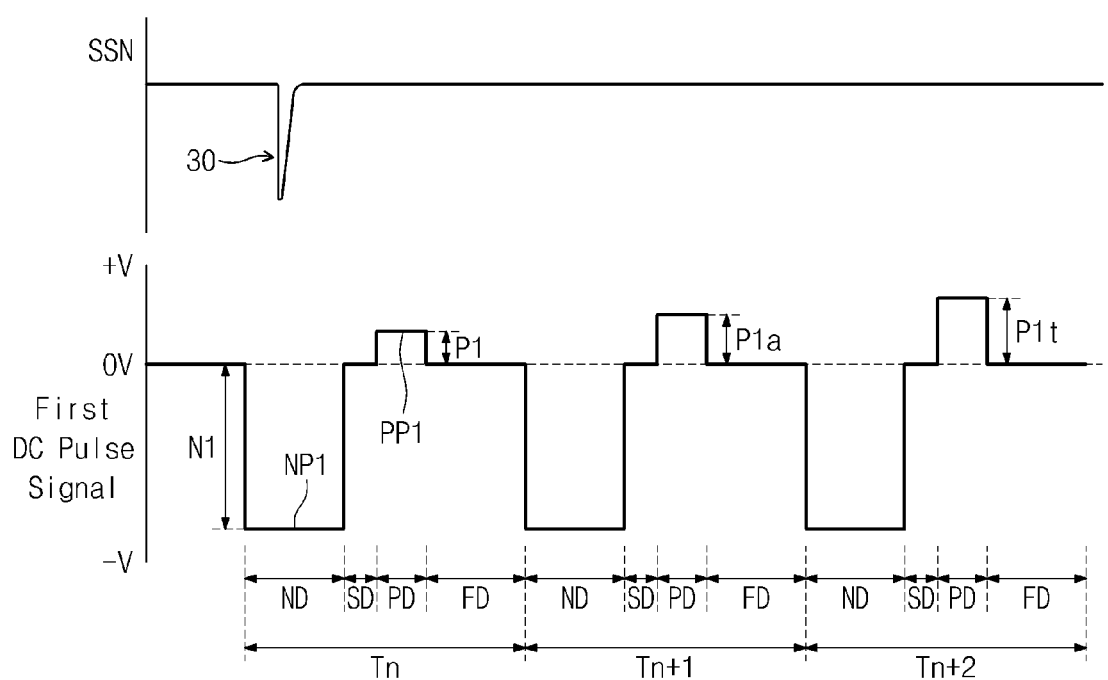
FIGS. 9A and 9B are graphs illustrating an exemplary method of operating a plasma apparatus according to other embodiments of the disclosure.
Figure 9B:
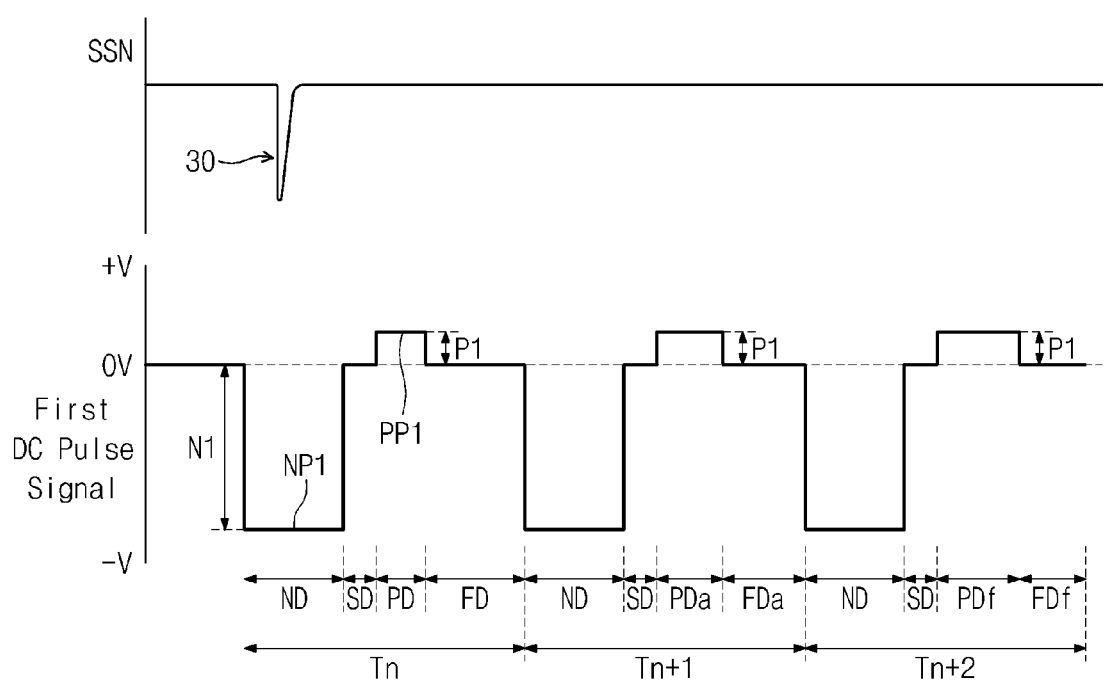

FIG. 8 is a flowchart illustrating an exemplary method of operating a plasma apparatus according to other embodiments of the disclosure. FIGS. 9A and 9B are graphs illustrating an exemplary method of operating a plasma apparatus according to other embodiments of the disclosure.

An operating method according to the present embodiment of FIG. 8 may include the steps S500, S510, S520 and S530 described with reference to FIG. 3.

Referring to FIGS. 1, 2B, and 8, if the signal disturbance 30 of the sensing signal SSN occurs in the $n^{th}$ period Tn of the first DC pulse signal, the first DC power generator 280 may stepwise change conditions of a plurality of periods of the first DC pulse signal immediately after the $n^{th}$ period Tn (S541). The conditions of the plurality of periods may include changes in magnitudes of first positive pulses and/or lengths of positive pulse durations of the plurality of periods.

In some embodiments, as illustrated in FIG. 9A, if the signal disturbance 30 occurs in the negative pulse duration ND of the $n^{th}$ period Tn, magnitudes P1a and P1t of the first positive pulses of $n+1^{th}$ and $n+2^{th}$ periods Tn+1 and Tn+2 may be respectively increased stepwise. Even though not shown in the drawings, a signal disturbance smaller than the signal disturbance 30 generated in the $n^{th}$ period Tn may occur in the $n+1^{th}$ period Tn+1 or $n+2^{th}$ period Tn+2. The magnitude N1 of the first negative pulse of the $n+2^{th}$ period Tn+2 may be greater than the magnitude P1t of the first positive pulse of the $n+2^{th}$ period Tn+2. Likewise, the magnitude N1 of the first negative pulse of the $n+1^{th}$ period Tn+1 may be greater than the magnitude P1a of the first positive pulse of the $n+1^{th}$ period Tn+1. Even though not shown in the drawings, magnitude and time length conditions of an $n+3^{th}$ period (e.g., the magnitude and length of the pulses) may be the same as those of the $n+2^{th}$ period Tn+2.

In other embodiments, as illustrated in FIG. 9B, if the signal disturbance 30 occurs in the negative pulse duration ND of the $n^{th}$ period Tn, lengths of the positive pulse durations PDa and PDf of the $n+1^{th}$ and $n+2^{th}$ periods Tn+1 and Tn+2 may be respectively increased stepwise. In this example, the total length of the $n^{th}$ period Tn may be equal to a total length of the $n+1^{th}$ period Tn+1 and a total length of the $n+2^{th}$ period Tn+2. Thus, lengths of pulse-off durations FDa and FDf of the $n+1^{th}$ and $n+2^{th}$ periods Tn+1 and Tn+2 may be each reduced stepwise. Even though not shown in the drawings, a signal disturbance smaller than the signal disturbance 30 generated in the $n^{th}$ period Tn may occur in the $n+1^{th}$ period Tn+1 or $n+2^{th}$ period Tn+2. Even though not shown in the drawings, magnitude and time length conditions of the $n+3^{th}$ period may be the same as those of the $n+2^{th}$ period Tn+2.

In still other embodiments, the method of FIG. 9A and the method of FIG. 9B may be combined with each other. In other words, in the step S541, the magnitudes P1a and P1t of the first positive pulses of the $n+1^{th}$ and $n+2^{th}$ periods Tn+1 and Tn+2 may be increased stepwise and the lengths of the positive pulse durations PDa and PDf of the $n+1^{th}$ and $n+2^{th}$ periods Tn+1 and Tn+2 may be increased stepwise. In this case, the total length of the $n^{th}$ period Tn may also be equal to the total length of the $n+1^{th}$ period Tn+1 and the total length of the $n+2^{th}$ period Tn+2.

In yet other embodiments, if the signal disturbance 30 occurs in the positive pulse duration PD of the $n^{th}$ period Tn, magnitudes of the first positive pulses and/or lengths of the positive pulse durations of the $n+1^{th}$ and $n+2^{th}$ periods Tn+1 and Tn+2 may be reduced stepwise.

FIGS. 9A and 9B illustrate two periods changed stepwise in the step S541. However, the disclosure is not limited thereto. In other embodiments, the plurality of periods with changes in the magnitude and time length conditions in the step S541 may be three or more.

If the signal disturbance 30 does not occur in the $n^{th}$ period Tn in the step S530, the $n+1^{th}$ period Tn+1 of the first DC pulse signal may be performed under the same conditions as the $n^{th}$ period Tn (S550).

Figure 10:
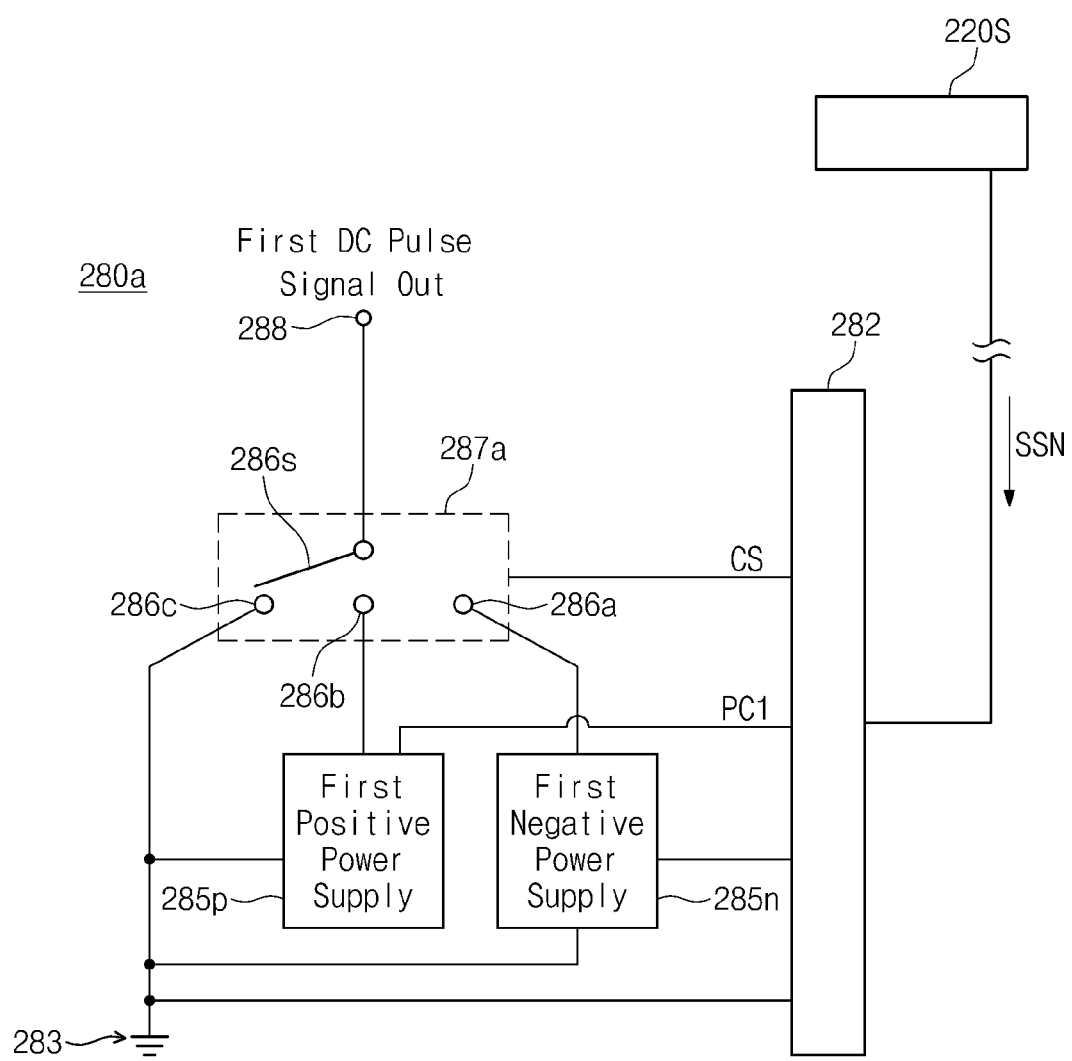
FIG. 10 is a schematic diagram illustrating another embodiment of a first DC power generator that may be included in the plasma apparatus illustrated in FIG. 1.

In another embodiment, the first DC power generator may be comprised differently. This will be described with reference to FIG. 10. FIG. 10 is a schematic diagram illustrating another embodiment of a first DC power generator that may be included in the plasma apparatus illustrated in FIG. 1.

Referring to FIG. 10, a first pulse modulator 287a of a first DC power generator 280a may have a switch structure having four terminals. In more detail, the first pulse modulator 287a may include a switching terminal 286s and first to third input terminals 286a, 286b and 286c. The switching terminal 286s may be connected to the first output terminal 288. The first, second and third input terminals 286a, 286b and 286c may be connected to the first negative power supply 285n, the first positive power supply 285p, and the first ground source 283, respectively. The switching terminal 286s may be selectively switched to the input terminals 286a, 286b and 286c in response to a control signal CS of the first controller 282, thereby outputting the first DC pulse signal having the durations ND, SD, PD and FD as illustrated in FIG. 2A. Other elements of the first DC power generator 280a may be the same as corresponding elements of the first DC power generator 280 illustrated in FIG. 2B.

In some embodiments, the second pulse modulator 297 of the second DC power generator 290 of FIG. 6 may have the same structure as the first pulse modulator 287a of FIG. 10.

Figure 11:
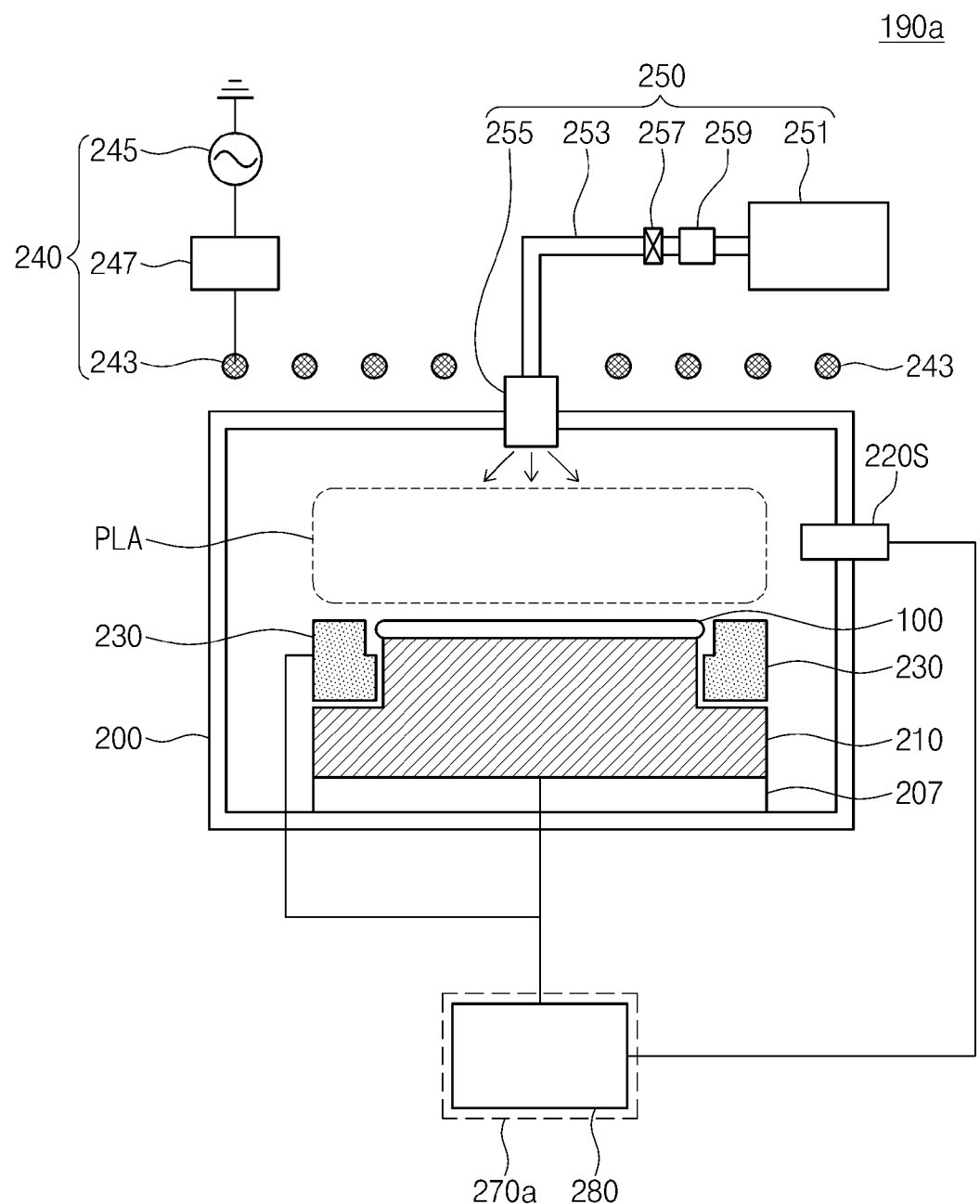
FIG. 11 is a schematic diagram illustrating a plasma apparatus according to other embodiments of the disclosure.

FIG. 11 is a schematic diagram illustrating a plasma apparatus according to other embodiments of the disclosure.

Referring to FIG. 11, a plasma apparatus 190a according to the present embodiment may include a DC power generating unit 270a having one DC power generator 280. In the present embodiment, the one DC power generator 280 may be electrically connected to both the chuck 210 and the outer ring 230. The one DC power generator 280 may provide the first DC pulse signal and the second DC pulse signal to the chuck 210 and the outer ring 230, respectively. In this case, the magnitude of the first negative pulse of the first DC pulse signal may be equal to the magnitude of the second negative pulse of the second DC pulse signal, and the magnitude of the first positive pulse of the first DC pulse signal may be equal to the magnitude of the second positive pulse of the second DC pulse signal. In other words, the one DC power generator 280 may provide the chuck 210 and the outer ring 230 with the same DC pulse signal.

The plasma apparatus 190 or 190a may perform at least one of various semiconductor manufacturing processes using plasma. In some embodiments, the plasma apparatus 190 or 190a may perform a process of etching a region having a high aspect ratio. For example, the plasma apparatus 190 or 190a may perform a process of etching a mold layer of a three-dimensional semiconductor memory device (e.g., a vertical NAND flash memory device) and/or an etching process for forming a lower electrode hole of a capacitor of a dynamic random access memory (DRAM) device. In other embodiments, the plasma apparatus 190 or 190a may perform a deposition process using plasma. In still other embodiments, the plasma apparatus 190 or 190a may perform a high-density plasma process for forming a high-density plasma oxide layer.

According to embodiments of the disclosure, if the signal disturbance of the sensing signal occurs in the $n^{th}$ period of the DC pulse signal, the DC power generator may change at least one of the magnitude and the length of pulses in subsequently generated DC pulse signals. For example, when a signal disturbance is sensed in the $n^{th}$ period of the DC pulse signal during the application of a negative pulse, the DC power generator may change at least one of the magnitude of the positive pulse and the length of the positive pulse duration of the $n+1^{th}$ period of the DC pulse signal. Thus, the signal disturbance may be minimized or prevented in the $n+1^{th}$ period. When the signal disturbance is caused by an arcing phenomenon, further arcing may be prevented or be reduced. In other words, it is possible to improve the reliability of the semiconductor manufacturing process using the plasma apparatus.

While the disclosure has been described with reference to example embodiments, it will be apparent to those skilled in the art that various changes and modifications may be made without departing from the spirit and scope of the disclosure. Therefore, it should be understood that the above embodiments are not limiting, but illustrative. Thus, the scope of the disclosure is to be determined by the broadest permissible interpretation of the following claims and their equivalents, and shall not be restricted or limited by the foregoing description.

What is claimed is:

1. A plasma apparatus comprising:
a process chamber having an inner, enclosed space;
a chuck disposed in the process chamber and having a top surface configured to load a substrate;
a gas supply unit supplying a process gas into the process chamber;
a plasma generating unit configured to generate plasma over the chuck;
a direct current (DC) power generator configured to apply a DC pulse signal to the chuck; and
a sensor configured to monitor a state of the plasma and provide a sensing signal to the DC power generator,
wherein the DC pulse signal comprises a series of periods, wherein each period of the DC pulse signal comprises: a negative pulse duration during which a negative pulse is applied; a positive pulse duration during which a positive pulse is applied; and a pulse-off duration during which the negative pulse and the positive pulse are turned-off, and
wherein the DC power generator is configured to change at least one of a magnitude of the positive pulse and a length of the positive pulse duration of an $n+1^{th}$ period of the DC pulse signal, where "n" denotes a natural number, upon detecting a signal disturbance of the sensing signal in an $n^{th}$ period of the DC pulse signal.

2. The plasma apparatus of claim 1, wherein the DC power generator comprises:
a negative power supply generating the negative pulse;
a positive power supply generating the positive pulse;
an output terminal electrically connected to the chuck;
a pulse modulator; and
a controller electrically connected to the sensor,
wherein the pulse modulator is configured to connect the output terminal with the negative power supply to supply the negative pulse, and the positive power supply to supply the positive pulse at different times, and
wherein the controller is configured to control the negative power supply, the positive power supply, and the pulse modulator, and
wherein the controller is further configured to change at least one of the magnitude of the positive pulse and the length of the positive pulse duration upon detection of a disturbance from the sensing signal.

3. The plasma apparatus of claim 1, wherein the DC power generator is configured to increase at least one of the magnitude of the positive pulse and the length of the positive pulse duration of the $n+1^{th}$ period in response to detecting a disturbance from the sensing signal during the negative pulse duration of the $n^{th}$ period.

4. The plasma apparatus of claim 3, wherein the DC power generator is configured to further increase at least one of a magnitude of the positive pulse and a length of the positive pulse duration of the $n+x^{th}$ period as compared to at least one of the magnitude of the positive pulse and the length of the positive pulse duration of the $n+y^{th}$ period, where "x" denotes a natural number greater than or equal to 2 and where "y" denotes a natural number less than "x" by 1.

5. The plasma apparatus of claim 1, wherein the DC power generator is configured to reduce at least one of the magnitude of the positive pulse and the length of the positive pulse duration of the $n+1^{th}$ period in response to detecting a disturbance from the sensing signal during the positive pulse duration of the $n^{th}$ period.

6. The plasma apparatus of claim 5, wherein the DC power generator is configured to further reduce at least one of a magnitude of the positive pulse and a length of the positive pulse duration of the $n+2^{th}$ period in response to detecting a disturbance from the sensing signal during the $n^{th}$ period.

7. The plasma apparatus of claim 1, wherein the positive pulse duration is after the negative pulse duration and before the pulse-off duration in each period of the DC pulse signal,
wherein each period of the DC pulse signal further comprises: a stable duration after the negative pulse duration and before the positive pulse duration, and
wherein a ground voltage is applied during the stable duration and the pulse-off duration.

8. The plasma apparatus of claim 7, wherein a length of the stable duration of the $n^{th}$ period is different from a length of the pulse-off duration of the $n^{th}$ period.

9. The plasma apparatus of claim 7, wherein the negative pulse duration is less than the sum of the positive pulse duration, the pulse-off duration, and the stable duration.

10. The plasma apparatus of claim 7, wherein the pulse-off duration is in a range of twice as long and 100 times as long as the stable duration.

11. The plasma apparatus of claim 1, wherein a total length of the $n^{th}$ period is equal to a total length of the $n+1^{th}$ period.

12. The plasma apparatus of claim 1, wherein the DC power generator changes at least one of a magnitude of the positive pulse and a length of the positive pulse duration of an $n+2^{th}$ period in response to detecting a disturbance form the sensing signal during the $n^{th}$ period.

13. The plasma apparatus of claim 1,
wherein a magnitude of the negative pulse of the $n^{th}$ period is greater than a magnitude of the positive pulse of the $n^{th}$ period, and
wherein a magnitude of the negative puke of the $n+1^{th}$ period is greater than the magnitude of the positive pulse of the $n+1^{th}$ period.

14. The plasma apparatus of claim 1,
wherein the chuck is an electrostatic chuck, and
wherein an insulator is disposed between the chuck and the bottom plate of the process chamber.

15. The plasma apparatus of claim 1, wherein the DC power generator is configured to apply the DC pulse signal to an outer ring disposed on an edge of the chuck and surrounding the loaded substrate.

16. The plasma apparatus of claim 1,
wherein the sensor is configured to measure an intensity of a light generated from the plasma and provide the sensing signal in real time, and
wherein the sensor is an optical emission sensor.

17. The plasma apparatus of claim 1, wherein the DC pulse signal is offset by a non-zero DC voltage.

18. The plasma apparatus of claim 1, wherein a magnitude of the negative pulse is in a range of 50 V to 10 kV, and a magnitude of the positive pulse PP1 is in a range of 15 V to 3 kV.

19. The plasma apparatus of claim 1,
wherein the plasma generating unit comprises an antenna electrode and a plasma power generator configured apply a radio frequency power to the antenna electrode to generate the plasma over the chuck,
wherein a frequency of the radio frequency power is in a range of 13.56 Hz to 2040.68 MHz, and
wherein a reciprocal of the period of the DC pulse signal is in a range of 50 Hz to 500 kHz.

20. The plasma apparatus of claim 1, wherein the DC power generator is a first DC power generator and the DC pulse signal is a first DC pulse signal, and the plasma apparatus further comprises:
an outer ring disposed on an edge of the chuck and surrounding the loaded substrate,
a second direct current (DC) power generator configured to apply a second DC pulse signal having continuous periods to the outer ring,
wherein each period of the second DC pulse signal comprises: a second negative pulse duration during which a second negative pulse is applied; a second positive pulse duration during which a second positive pulse is applied; and a pulse-off duration during which the second negative pulse and the second positive pulse are turned-off,
wherein the first and second DC power generators are configured to apply the first and second DC pulse signals at the same time, and
wherein each period of the second DC pulse signal is synchronized with each period of the first DC pulse signal.

* * * * *